(12) United States Patent
Weng et al.

(10) Patent No.: US 12,293,713 B2
(45) Date of Patent: May 6, 2025

(54) DISPLAY SUBSTRATE AND METHOD FOR DRIVING SAME, AND DISPLAY APPARATUS

(71) Applicants: Fuzhou BOE Optoelectronics Technology Co., Ltd., Fujian (CN); BOE Technology Group Co., Ltd., Beijing (CN)

(72) Inventors: Zuwei Weng, Beijing (CN); Bin Weng, Beijing (CN); Yupeng Huang, Beijing (CN); Bao Liu, Beijing (CN); Qiaohong Huang, Beijing (CN)

(73) Assignees: Fuzhou BOE Optoelectronics Technology Co., Ltd., Fujian (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/031,336

(22) PCT Filed: Mar. 23, 2022

(86) PCT No.: PCT/CN2022/082596
§ 371 (c)(1),
(2) Date: Apr. 11, 2023

(87) PCT Pub. No.: WO2023/178570
PCT Pub. Date: Sep. 28, 2023

(65) Prior Publication Data
US 2024/0371322 A1     Nov. 7, 2024

(51) Int. Cl.
*G09G 3/3233*     (2016.01)
*H10K 59/121*     (2023.01)
*H10K 59/131*     (2023.01)

(52) U.S. Cl.
CPC ....... *G09G 3/3233* (2013.01); *H10K 59/1213* (2023.02); *H10K 59/131* (2023.02); *G09G 2300/0819* (2013.01); *G09G 2300/0842* (2013.01); *G09G 2300/0861* (2013.01);
(Continued)

(58) Field of Classification Search
CPC ......... G09G 3/3233; G09G 2300/0819; G09G 2300/0842; G09G 2300/0861; G09G 2310/08; G09G 2320/0223; G09G 2320/0233; H10K 59/131; H10K 59/1213
See application file for complete search history.

(56) References Cited

FOREIGN PATENT DOCUMENTS

WO      WO-2020238490 A1 * 12/2020     ........... G09G 3/3225

* cited by examiner

*Primary Examiner* — Stacy Khoo
(74) *Attorney, Agent, or Firm* — IPro, PLLC

(57) ABSTRACT

Provided is a display substrate. A data writing circuit included in each pixel circuit is coupled to a first scanning line, a switching control line, a data signal line, and a drive circuit. The data writing circuit transmits, under the control of the first scanning line and the switching control line, a data signal provided by the data signal line to the drive circuit, such that the drive circuit drives the coupled light-emitting element to emit light. In the same pixel circuit group, each pixel circuit subgroup is coupled to a different switching control line, and the plurality of coupled data signal lines are coupled to the same data line to receive the data signals from the data line. Thus, each pixel circuit, under the control of the switching control line coupled thereto, receives the data signal provided by the data line for the data signal line coupled thereto.

20 Claims, 11 Drawing Sheets

(52) U.S. Cl.
CPC . *G09G 2310/08* (2013.01); *G09G 2320/0223* (2013.01); *G09G 2320/0233* (2013.01)

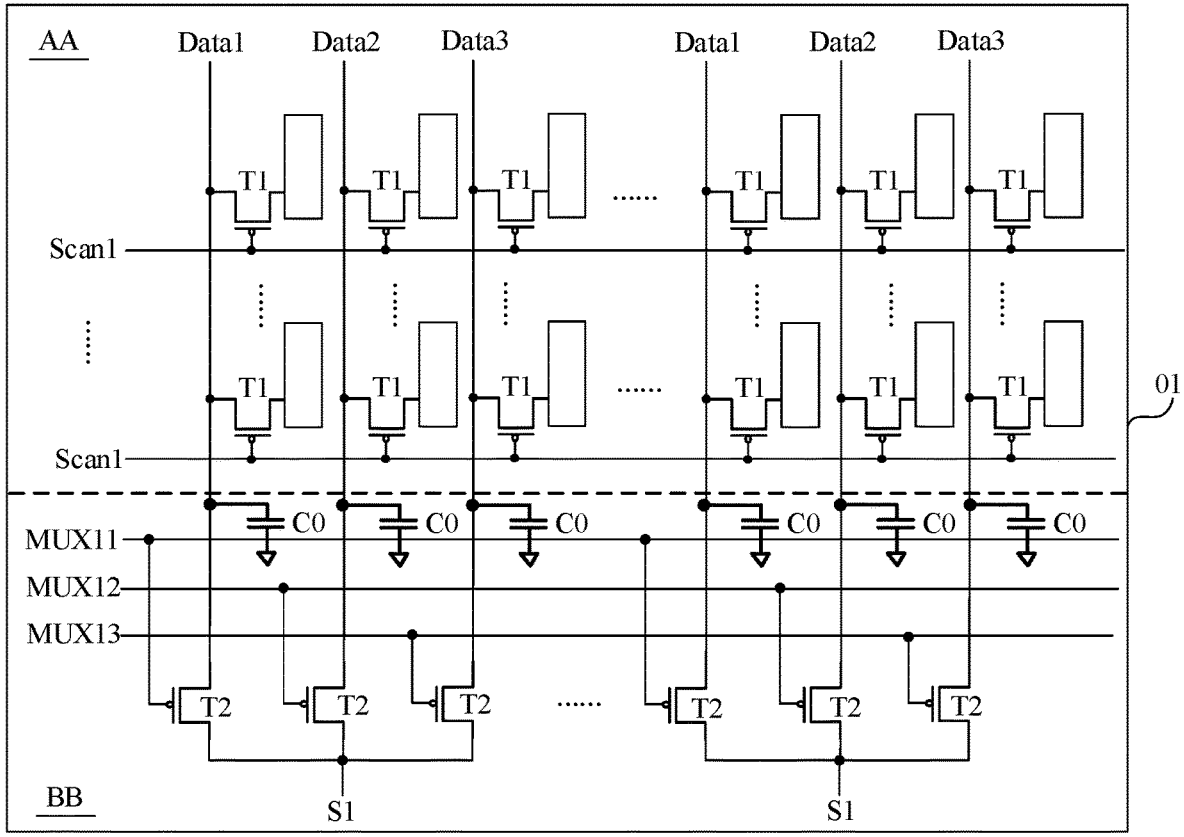

FIG. 11

Providing, by a plurality of switching control lines, switching control signals in different periods of time; providing, by a plurality of first scanning lines, first scanning signals in different periods of time; and controlling, by a data writing circuits in a plurality of pixel circuits included in the different pixel circuit subgroups, connection of a data signal line to a drive circuit in response to the first scanning signal and the switching control signal at different time, to enable the data signal line to transmit a data signal from a data line to the driver circuit   1201

FIG. 12

At an initialization stage, the potential of the second scanning signal provided by the second scanning line and the potential of the first light emission control signal provided by the first light emission control line are both the first potential; the potential of the first scanning signal provided by the first scanning line, the potential of the switching control signal provided by the switching control line, and the potential of the second light emission control signal provided by the second light emission control line are all the second potential, the initializing circuit controls the connection of the initializing signal line to the third node and the first electrode of the light-emitting element in response to the second scanning signal, to enable the initializing signal line to transmit the initializing signal to the third node and the first electrode of the light-emitting element; the light emission control sub-circuit controls the connection of the first node to the third node and the connection of the first power line to the second node in response to the first light emission control signal, to enable the first power line to transmit the first power signal to the second node — 1301

At a data writing stage, the potential of the first scanning signal, the potential of the second scanning signal, the potential of the switching control signal, and the potential of the second light emission control signal provided by the second light emission control line are all the first potential; the potential of the first light emission control signal is the second potential; the initializing circuit controls the connection of the initializing signal line to the third node and the first electrode of the light-emitting element in response to the second scanning signal; the data writing circuit controls the connection of the data signal line to the first node in response to the first scanning signal and the switching control signal, to enable the data signal line to transmit the data signal from the data line to the first node; the light emission control sub-circuit controls the connection of the second node to the fourth node in response to the second light emission control signal — 1302

At a light emission stage, the potential of the first light emission control signal and the potential of the second light emission control signal are both the first potential; the potential of the first scanning signal, the potential of the second scanning signal, and the potential of the switching control signal are all the second potential; the light emission control sub-circuit controls, in response to the first light emission control signal, the connection of the first power line to the second node and the connection of the first node to the third node, and controls the connection of the second node to the fourth node in response to the second light emission control signal; the drive sub-circuit drives the light-emitting element to emit light by transmitting the light emission driving signal to the first electrode of the light-emitting element based on the potential of the third node and the potential of the fourth node — 1303

FIG. 13

DISPLAY SUBSTRATE AND METHOD FOR DRIVING SAME, AND DISPLAY APPARATUS

CROSS-REFERENCE TO RELATED APPLICATION

This application is a U.S. national stage of international application No. PCT/CN2022/082596, filed on Mar. 23, 2022, the disclosure of which is incorporated herein by reference in its entirety.

TECHNICAL FIELD

The present disclosure relates to the field of display technologies, and in particular, relates to a display substrate and a method for driving the same, and a display apparatus.

BACKGROUND

A display substrate generally includes a plurality of pixel circuits and a plurality of light-emitting elements. Each of the plurality of pixel circuits is coupled to a scanning signal line, a data signal line, a power terminal, and a light-emitting element, and each of the plurality of pixel circuits is configured to provide a light emission driving signal for the light-emitting element based on a scanning signal provided by the scanning signal line, a data signal provided by the data signal line and a power signal provided by the power terminal, thereby driving the light-emitting element to emit light.

SUMMARY

The embodiments of the present disclosure provide a display substrate, a method for driving the same, and a display apparatus.

In some embodiments of present disclosure, a display substrate is provided. The display substrate includes:
  a substrate including a display region and a non-display region, wherein the display region is surrounded by at least part of the non-display region;
  a plurality of light-emitting elements disposed in the display region;
  a plurality of pixel circuit groups disposed in the display region, at least one of the pixel circuit groups including a plurality of pixel circuit subgroups arranged in a first direction, each of the plurality of pixel circuit subgroups including a plurality of pixel circuits arranged in a second direction, and the first direction intersecting the second direction;
  a plurality of first scanning lines and a plurality of data signal lines disposed in the display region and the non-display region and coupled to the plurality of pixel circuit subgroups in the plurality of pixel circuit groups; and
  a plurality of switching control lines and a plurality of data lines disposed in the non-display region and coupled to the plurality of pixel circuit subgroups in the plurality of pixel circuit groups;
  wherein at least one of the pixel circuits includes a data writing circuit and a drive circuit; the data writing circuit being coupled to the first scanning line, the switching control line, the data signal line, and the drive circuit, and the data writing circuit being configured to control, in response to a first scanning signal provided by the first scanning line and a switching control signal provided by the switching control line, connection and disconnection between the data signal line and the drive circuit; the drive circuit being further coupled to the light-emitting element, and the drive circuit being configured to drive the light-emitting element to emit light in response to a data signal provided by the data writing circuit; and
  the pixel circuits included in the same pixel circuit subgroup being coupled to the same switching control line, and the pixel circuits comprised in the same pixel circuit subgroup being coupled to the same data signal line; the plurality of pixel circuit subgroups in the same pixel circuit group being coupled to the different switching control lines, and the plurality of data signal lines coupled to the plurality of pixel circuit subgroups in the same pixel circuit group being coupled to the same data line, wherein the plurality of data signal lines are configured to receive a data signal from the data line.

In some embodiments, at least two pixel circuit subgroups in different pixel circuit groups are configured to share one of the plurality of switching control lines.

In some embodiments, the plurality of pixel circuit subgroups included in each of the plurality of pixel circuit groups are configured to share the plurality of switching control lines.

In some embodiments, the number of the pixel circuit subgroups included in each of the pixel circuit groups is greater than or equal to 2 and is less than or equal to 5.

In some embodiments, the plurality of switching control lines and the plurality of first scanning lines are configured to extend in the first direction; and the plurality of data signal lines and the plurality of data lines are configured to extend in the second direction.

In some embodiments, the first direction and the second direction are perpendicular to each other.

In some embodiments, the plurality of switching control lines are configured to provide switching control signals for data writing circuits of different pixel circuit subgroups in different periods of time.

In some embodiments, the data writing circuit includes: a data writing sub-circuit and a switching sub-circuit; wherein
  the data writing sub-circuit is coupled to the first scanning line, the data signal line, and the switching sub-circuit, and the data writing sub-circuit is configured to control, in response to the first scanning signal, connection and disconnection between the data signal line and the switching sub-circuit; and
  the switching sub-circuit is further coupled to the switching control line and the drive circuit, and the switching sub-circuit is configured to control, in response to the switching control signal, connection and disconnection between the data writing sub-circuit and the drive circuit.

In some embodiments, the data writing sub-circuit includes: a data writing transistor; wherein a gate of the data writing transistor is coupled to the first scanning line, a first electrode of the data writing transistor is coupled to the data signal line, and a second electrode of the data writing transistor is coupled to the switching sub-circuit.

In some embodiments, the switching sub-circuit includes: a switching transistor; wherein a gate of the switching transistor is coupled to the switching control line, a first electrode of the switching transistor is coupled to the data writing sub-circuit, and a second electrode of the switching transistor is coupled to the drive circuit.

In some embodiments, the display substrate further includes: a plurality of first light emission control lines, a plurality of second light emission control lines, a plurality of second scanning lines, a plurality of initializing signal lines, and a plurality of first power lines, wherein the plurality of first light emission control lines, the plurality of second light emission control lines, the plurality of second scanning lines, the plurality of initializing signal lines, and the plurality of first power lines are disposed in the display region and the non-display region and coupled to the plurality of pixel circuit subgroups in the plurality of pixel circuit groups; the drive circuit includes: an initializing circuit and a light emission drive circuit; wherein the initializing circuit is coupled to the second scanning line, the initializing signal line, the light emission drive circuit, and a first electrode of the light-emitting element, and the initializing circuit is configured to control, in response to a second scanning signal provided by the second scanning line, connection and disconnection between the initializing signal line and the light emission drive circuit and connection and disconnection between the initializing signal line and the first electrode of the light-emitting element;

the light emission drive circuit is further coupled to the data writing circuit, the first power line, the first light emission control line, the second light emission control line, and the first electrode of the light-emitting element, and the light emission drive circuit is configured to transmit a light emission driving signal to the first electrode of the light-emitting element in response to a data signal provided by the data writing circuit, a first light emission control signal provided by the first light emission control line, a second light emission control signal provided by the second light emission control line, and a first power signal provided by the first power line; and a second electrode of the light-emitting element is coupled to a second power line, and the light-emitting element is configured to emit light in response to the light emission driving signal and a second power signal provided by the second power line.

In some embodiments, the light emission drive circuit includes: a storage sub-circuit, a light emission control sub-circuit, and a drive sub-circuit; wherein the storage sub-circuit is coupled to the data writing circuit and the light emission control sub-circuit, and the storage sub-circuit is configured to regulate a potential at a coupling node;

the light emission control sub-circuit is further coupled to the first light emission control line, the second light emission control line, the first power line, the data writing circuit, and the drive sub-circuit, and the light emission control sub-circuit is configured to control, in response to the first light emission control signal and the second light emission control signal, connection and disconnection between the first power line and the drive sub-circuit; and the drive sub-circuit is further coupled to the first electrode of the light-emitting element, and the drive sub-circuit is configured to transmit, in response to a signal provided by the light emission control sub-circuit, a light emission driving signal to the first electrode of the light-emitting element.

In some embodiments, the light emission control sub-circuit includes: a first light emission control transistor, a second light emission control transistor, and a third light emission control transistor; wherein a gate of the first light emission control transistor is coupled to the first light emission control line, a first electrode of the first light emission control transistor is coupled to the first power line, and a second electrode of the first light emission control transistor is coupled to a first electrode of the third light emission control transistor;

a gate of the second light emission control transistor is coupled to the first light emission control line, a first electrode of the second light emission control transistor is coupled to the data writing circuit, and a second electrode of the second light emission control transistor is coupled to the drive sub-circuit and the initializing circuit; and a gate of the third light emission control transistor is coupled to the second light emission control line, and a second electrode of the third light emission control transistor is coupled to the drive sub-circuit.

In some embodiments, the drive sub-circuit includes: a drive transistor; wherein a gate of the drive transistor is coupled to the light emission control sub-circuit and the initializing circuit, a first electrode of the drive transistor is coupled to the light emission control sub-circuit, and a second electrode of the drive transistor is coupled to the first electrode of the light-emitting element.

In some embodiments, the storage sub-circuit includes: a storage capacitor; wherein a first terminal of the storage capacitor is coupled to the data writing circuit, and a second terminal of the storage capacitor is coupled to the light emission control sub-circuit.

In some embodiments, the initializing circuit includes: a first initializing transistor and a second initializing transistor; wherein a gate of the first initializing transistor and a gate of the second initializing transistor are coupled to the second scanning line, a first electrode of the first initializing transistor and a first electrode of the second initializing transistor are coupled to the initializing signal line, a second electrode of the first initializing transistor is coupled to the light emission drive circuit, and a second electrode of the second initializing transistor is coupled to the first electrode of the light-emitting element.

In some embodiments of present disclosure, a method for driving a display substrate is provided. The method is applicable to drive the display substrate as defined in the above aspect. The method includes: providing, by the plurality of switching control lines, the switching control signals in different periods of time; providing, by the plurality of first scanning lines, the first scanning signals in different periods of time; and controlling, by the data writing circuits in the plurality of pixel circuits included in different pixel circuit subgroups, the connection of the data signal line to the drive circuit in response to the first scanning signal and the switching control signal at different time, to enable the data signal line to transmit the data signal from the data line to the drive circuit.

In some embodiments of present disclosure, a display apparatus is provided. The display apparatus includes: a first drive circuit, a second drive circuit, and a display substrate as defined in the above aspect; wherein the first drive circuit is coupled to a plurality of switching control lines in the display substrate, and the first drive circuit is configured to provide a switching control signal for the plurality of switching control lines; and the second drive circuit is coupled to a plurality of data lines in the display substrate, and the second drive circuit is configured to provide a data signal for the plurality of data lines.

In some embodiments, the first drive circuit and the second drive circuit are integrated.

BRIEF DESCRIPTION OF THE DRAWINGS

For clearer illustration of the technical solutions in embodiments of the present disclosure, accompanying drawings required for describing the embodiments are briefly introduced hereinafter. It is apparent that the accompanying drawings described hereinafter merely illustrate some embodiments of the present disclosure, and those of ordinary skill in the art may derive other drawings from these accompanying drawings without creative efforts.

FIG. 11 is a schematic diagram of a structure of a display substrate in other practices according to some embodiments of the present disclosure;

FIG. 12 is a flowchart of a method for driving a display substrate according to some embodiments of the present disclosure;

FIG. 13 is a flowchart of a method for driving a pixel circuit according to some embodiments of the present disclosure.

DETAILED DESCRIPTION

Figure 1:
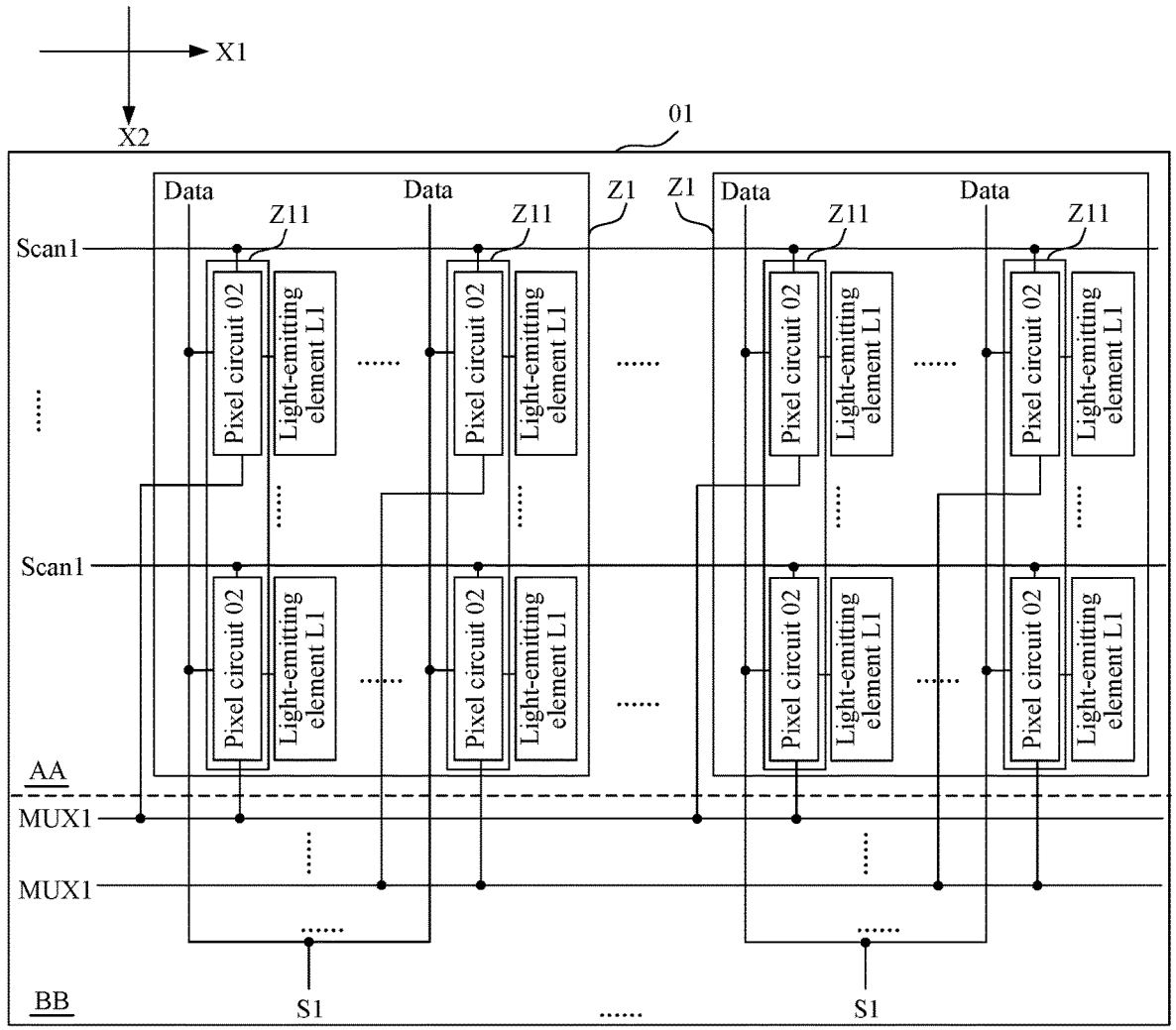
FIG. 1 is a schematic diagram of a structure of a display substrate according to some embodiments of the present disclosure.

For clearer descriptions of the objectives, technical solutions, and advantages of the present disclosure, embodiments of the present disclosure are described in detail hereinafter with reference to the accompanying drawings.

Transistors employed in all embodiments of the present disclosure are thin-film transistors or field-effect transistors or other devices having the same characteristics. The transistors employed in the embodiments of the present disclosure are mainly switching transistors according to functions in circuits. Since a source and a drain of the switching transistor employed herein are symmetrical, the source and drain are interchangeable. In the embodiments of the present disclosure, the source is referred to as a first electrode and the drain is referred to as a second electrode, or alternatively, the drain is referred to as a first electrode and the source is referred to as a second electrode. It is provided according to the form in the drawings that a middle terminal of a transistor is a gate, a signal input terminal is the source and a signal output terminal is the drain. In addition, in some embodiments, the switching transistor employed in the embodiments of the present disclosure includes a P-type transistor, or an N-type transistor, or a combination thereof. The P-type transistor is turned on in a case that the gate is at a low level and turned off in a case that the gate is at a high level. The N-type transistor is turned on in a case that the gate is at a high level and turned off in a case that the gate is at a low level. In addition, various signals in the embodiments of the present disclosure correspond to a first potential and a second potential, wherein the first potential and the second potential only represent that the signal has two different state quantities of potential, rather than that the first potential or the second potential has a specific value throughout the disclosure. Furthermore, in some embodiments, "coupling" recited in embodiments of the present disclosure refers to electrical connection.

Compared with a liquid crystal display (LCD) apparatus, an organic light-emitting diode (OLED) display apparatus has advantages of wide color gamut, high contrast, energy saving, foldability, and the like, thereby having strong competitiveness among display apparatuses. On this basis, active-matrix organic light-emitting diode (AMOLED) display apparatuses derived from the OLED display apparatus are also gradually becoming one of the key development directions of flexible display. The OLED display apparatus and the AMOLED apparatus are referred to as OLED type display apparatuses.

Currently, in OLED type display apparatuses, each pixel includes a plurality of sub-pixels of different colors, wherein each of the plurality of sub-pixels includes a pixel circuit and a light-emitting element. The pixel circuit generally includes a switching transistor, a drive transistor, and a storage capacitor, i.e., a 2T1C structure (including 2 transistors and 1 capacitor). The pixel circuit is configured to drive the light-emitting element to emit light by transmitting a driving current to the light-emitting element in response to a data signal provided by a data signal line coupled to the pixel circuit. The driving current $I_0=(Vgs-Vth)^2$. Vgs refers to a gate-source voltage difference of the drive transistor, and Vth is a threshold voltage of the drive transistor. However, the threshold voltage Vth of the drive transistor is prone to drift and the signal line coupled to the pixel circuit has a voltage drop (IR), it is known from the driving current formula that the driving current transmitted from the pixel circuit to the light-emitting element has poor stability, which leads to poor display uniformity of the display substrate and compromised display quality.

In addition, for a high-resolution display product, in a case that each column of pixel circuits is coupled to one data signal line, a large number of channels are required in a driver integrated circuit (Driver IC), wherein the Driver IC is configured to be coupled to the data signal line for providing data signals for the data signal line. Taking an 8K display product as an example, the resolution is typically 4320×7680 pixels, i.e., including 4320 rows and 7680 columns of pixels. In a case that each pixel includes three sub-pixels, the display product includes: 7680×3=23040 columns of sub-pixels. Correspondingly, 23040 channels are required in the Driver IC. In view of limitations in a module bonding process (e.g., small COF pitch) and the cost, it is desirable to reduce the number of channels required in the Driver IC, or to reduce the number of Driver ICs.

On this basis, currently, a multiplex (MUX) circuit is usually arranged in a non-display region of a display substrate, and a plurality of data signal lines are coupled to the same data line through the MUX circuit. The data line is then coupled to the Driver IC, such that data signals provided by the Driver IC is transmitted to the plurality of data signal lines through the MUX circuit. In this way, fewer data lines are required for coupling to the Driver IC, and correspondingly, the number of channels required in the Driver IC is reduced. However, a test shows that due to the existence of parasitic capacitance on the data signal lines, the data signals which are finally transmitted to the pixel circuits through the data signal lines sharing one data line are different, which leads to the different brightness of light emitted by each row of light-emitting elements, affecting the display uniformity of the display substrate.

The embodiments of the present disclosure provide a display substrate, which solves the problem of poor display uniformity of conventional display substrates caused by threshold voltage drift, IR voltage drop, and parasitic capacitance on the premise of reducing the number of channels required in a Driver IC, resulting in good display quality.

FIG. 1 is a schematic diagram of a structure of a display substrate according to some embodiments of the present disclosure. As shown in FIG. 1, the display substrate includes: a substrate 01, including a display region AA and a non-display region BB, wherein the display region AA is surrounded by at least part of the non-display region BB. In some embodiments, the non-display region BB shown in FIG. 1 is disposed below the display region AA and adjacent to the display region AA, i.e., partially surrounding the display region AA. The non-display region BB is not limited to being disposed below the display region AA, for example, the non-display region BB is disposed above the display region AA, or the display region AA is surrounded by the non-display region BB.

It should be noted that the area of the display region AA is generally much greater than that of the non-display region BB, and the accompanying drawings are merely a schematic illustration rather than a limitation to the areas of the display region AA and the non-display region BB. Referring to FIG. 1, it is seen that the display substrate provided in the embodiments of the present disclosure further includes: a plurality of light-emitting elements L1 and a plurality of pixel circuit groups Z1 disposed in the display region AA, a plurality of first scanning lines Scan1 and a plurality of data signal lines Data disposed in the display region AA and the non-display region BB, and a plurality of switching control lines MUX1 and a plurality of data lines S1 disposed in the non-display region BB.

The plurality of light-emitting elements L1 and a plurality of pixel circuit groups Z1 disposed in the display region AA. In some embodiments, at least one of the plurality of pixel circuit groups Z1 includes a plurality of pixel circuit subgroups Z11 arranged in a first direction X1, each of the pixel circuit subgroups Z11 includes a plurality of pixel circuits 02 arranged in a second direction X2, wherein the first direction X1 intersects the second direction X2. For example, each pixel circuit group Z1 shown in FIG. 1 includes a plurality of pixel circuit subgroups Z11, and the first direction X1 and the second direction X2 are perpendicular to each other. On this basis, it is regarded that the plurality of pixel circuits 02 in the display substrate are arranged in an array of rows and columns, that is, the display substrate includes rows and columns of pixel circuits 02. In some embodiments, the first direction X1 refers to the direction of rows, and the second direction X2 refers to the direction of columns.

The plurality of first scanning lines Scan1 and a plurality of data signal lines Data disposed in the display region AA and the non-display region BB, wherein the plurality of first scanning lines Scan1 and the plurality of data signal lines Data are coupled to the plurality of pixel circuit subgroups Z11 in the plurality of pixel circuit groups Z1.

The plurality of switching control lines MUX1 and a plurality of data lines S1 disposed in the non-display region BB, wherein the plurality of switching control lines MUX1 and the plurality of data lines S1 are coupled to the plurality of pixel circuit subgroups Z11 in the plurality of pixel circuit groups Z1.

Figure 2:
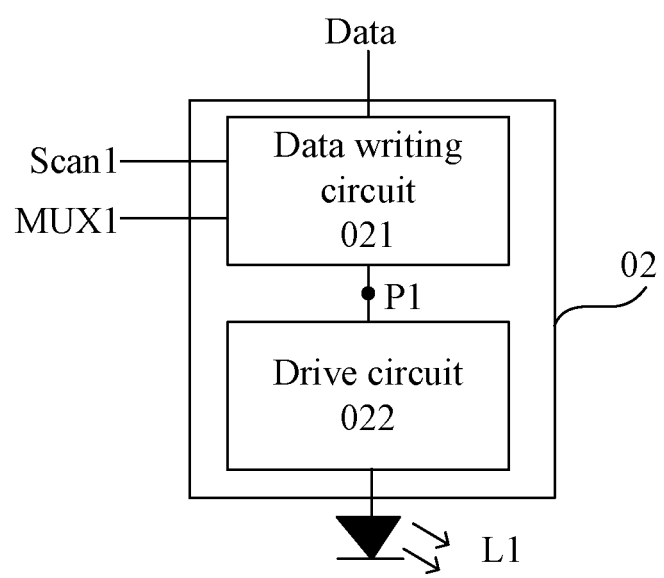
FIG. 2 is a schematic diagram of a structure of a pixel circuit according to some embodiments of the present disclosure.

It is known from the structure shown in FIG. 2 that at least one pixel circuit 02 in the embodiments of the present disclosure includes a data writing circuit 021 and a drive circuit 022. The data writing circuit 021 is coupled to the first scanning line Scan1, the switching control line MUX1, the data signal line Data, and the drive circuit 022. The data writing circuit 021 is configured to control, in response to a first scanning signal provided by the first scanning line Scan1 and a switching control signal provided by the switching control line MUX1, connection and disconnection between the data signal line Data and the drive circuit 022. The drive circuit 022 is further coupled to the light-emitting element L1, and the drive circuit 022 is configured to drive the light-emitting element L1 to emit light in response to a data signal provided by the data signal line Data. The coupling node between the data writing circuit 021 and the drive circuit 022 is denoted by the first node P1 in FIG. 2.

For example, the data writing circuit 021 controls the connection of the data signal line Data to the drive circuit 022 (i.e., the first node P1) in a case that both the potential of the first scanning signal provided by the first scanning line Scan1 and the potential of the switching control signal provided by the switching control line MUX1 are the first potential. And the data signal line Data transmits a data signal to the first node P1. The drive circuit 022 drives the light-emitting element L1 to emit light by transmitting a light emission driving signal (e.g., a driving current) to the light-emitting element L1 in response to the data signal written into the first node P1. The data writing circuit 021 controls the decoupling of the data signal line Data from the drive circuit 022 in a case that the potential of the first scanning signal and/or the potential of the switching control signal is the second potential. Then, the data signal line Data is unable to transmit a data signal to the first node P1.

In some embodiments of the present disclosure, the first potential is an active potential, and the second potential is a non-active potential, wherein the first potential is a lower potential relative to the non-active potential. In some other embodiments, the first potential is a higher potential relative to the second potential.

It is seen in FIG. 1 and FIG. 2 that the same pixel circuit subgroup Z11 (i.e., the pixel circuits 02 in the same column) in the embodiments of the present disclosure is coupled to the same switching control line MUX1 and the same data signal line Data. The plurality of pixel circuit subgroups Z11 in the same pixel circuit group Z1 (i.e., columns of pixel circuits 02 belonging to the same pixel circuit group Z1) are coupled to different switching control lines MUX1, and the plurality of data signal lines Data coupled to the plurality of pixel circuit subgroups Z11 in the same pixel circuit group Z1 are coupled to the same data line S1 and receive data signals from the data line S1. Moreover, the pixel circuits 02 disposed in the same row share one first scanning line Scan1. In some embodiments, the data line S1 is coupled to the Driver IC to receive a data signal provided by the Driver IC.

That is, in the embodiments of the present disclosure, different pixel circuits 02 share the same data line S1 through the data writing circuits 021 included therein, and it is regarded that an MUX circuit is integrated in each pixel circuit 02. Moreover, in a case that one pixel circuit group Z1 including columns of pixel circuits 02 (i.e., the plurality of pixel circuit subgroups Z11) is coupled to one data line S1, the number of the data lines S1 in the display substrate is equal to the number of the pixel circuit groups Z1 but less than the number of the data signal lines Data. In this way, it is ensured that the number of channels required in the Driver IC is reduced, and the difference of data signals transmitted to the columns of pixel circuits 02 via the same data line S1 as a result of the presence of parasitic capacitance on the data signal line Data is avoided. Therefore, the display uniformity of the display substrate provided in the embodiments of the present disclosure is great.

In summary, the embodiments of the present disclosure provide a display substrate. In the display substrate, a data writing circuit included in each pixel circuit is coupled to a first scanning line, a switching control line, a data signal line, and a drive circuit. The data writing circuit transmits a data signal provided by the data signal line to the drive circuit in response to a first scanning signal provided by the first scanning line and a switching control signal provided by the switching control line, such that the drive circuit drives the coupled light-emitting element to emit light. In the same pixel circuit group, each pixel circuit subgroup is coupled to a different switching control line, and the plurality of data signal lines coupled to each pixel circuit subgroup are coupled to the same data line to receive the data signals from the data line. Thus, each pixel circuit, under the control of the switching control line coupled thereto, receives the data signal provided by the data line for the data signal line coupled thereto. Furthermore, the data signals received by the pixel circuits from the shared data line are consistent, the brightness of light emitted by the light-emitting elements are uniform, and the display uniformity of the display substrate is good.

In some embodiments of the present disclosure, the plurality of switching control lines MUX1 are configured to provide switching control signals for data writing circuits 021 in different pixel circuit subgroups Z1 in different periods of time. The switching control signal provided here refers to a switching control signal providing an active potential.

In other words, in the same period of time, in a case that one switching control line MUX1 provides a switching control signal of an active potential, other switching control lines MUX1 than the switching control line MUX1 provide switching control signals of non-active potentials. In this way, in each pixel circuit subgroup Z11 (i.e., each column of pixel circuits 02) included in each pixel circuit group Z1, the data writing circuits 021 sequentially transmits the data signals provided by the shared data line S1 to the coupled drive circuit 022 at different time. That is, the columns of light-emitting elements L1 emit light sequentially, such that the display effect of the display substrate is ensured.

Figure 3:
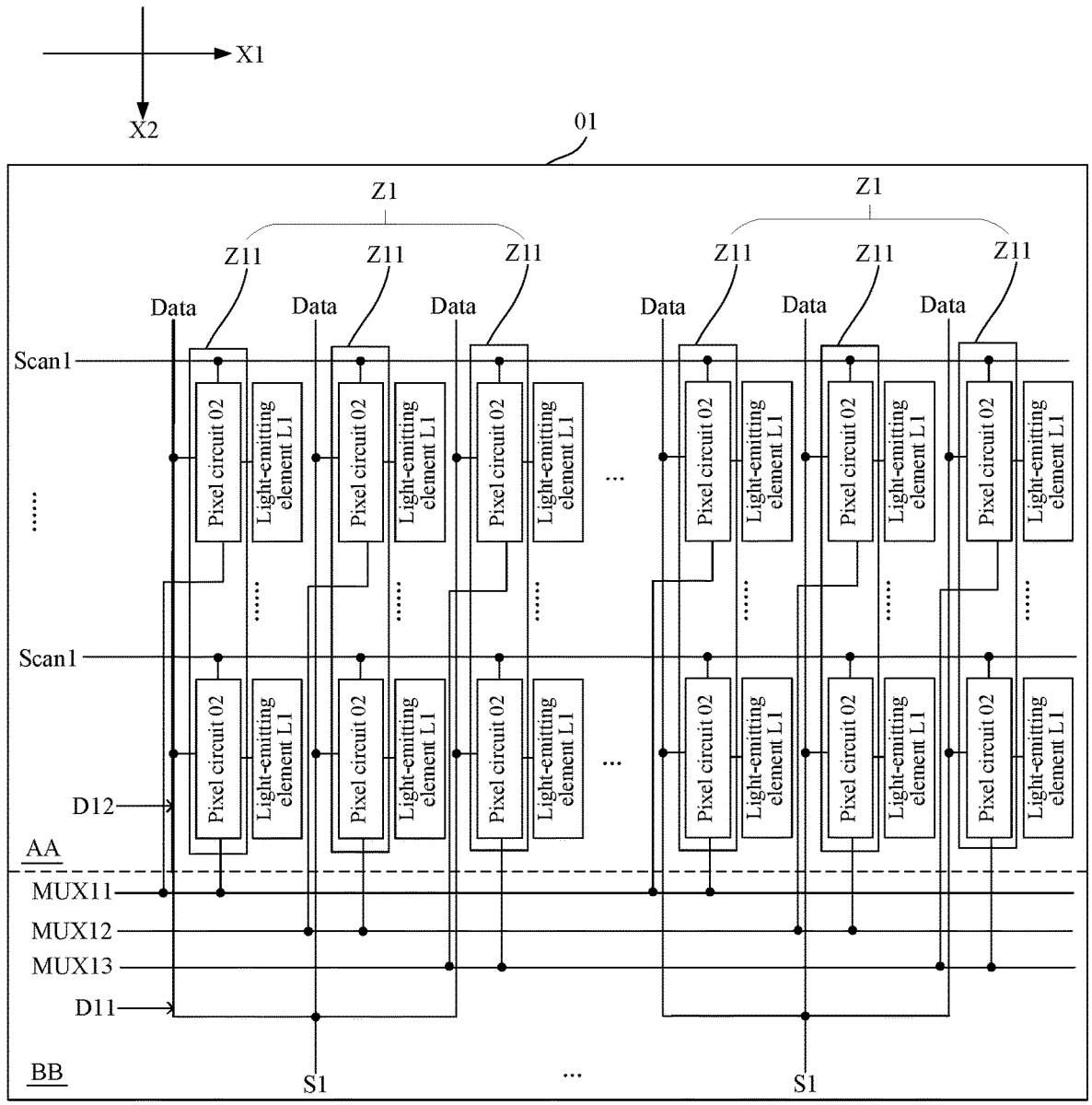
FIG. 3 is a schematic diagram of a structure of another display substrate according to some embodiments of the present disclosure.

FIG. 3 is a schematic diagram of a structure of another display substrate according to some embodiments of the present disclosure. It is known from FIG. 1 and FIG. 3 that the pixel circuit subgroups Z11 included in each pixel circuit group Z1 in some embodiments of the present disclosure are adjacent, that is, the columns of pixel circuits 02 belonging to the same pixel circuit group Z1 are adjacent. In this way, it is regarded that adjacent columns of pixel circuits 02 (e.g., the first column of pixel circuits 02, the second column of pixel circuits 02, and the third column of pixel circuits 02) share one data line S1. This arrangement facilitates routing, simplify the structure and reduce cost.

Figure 4:
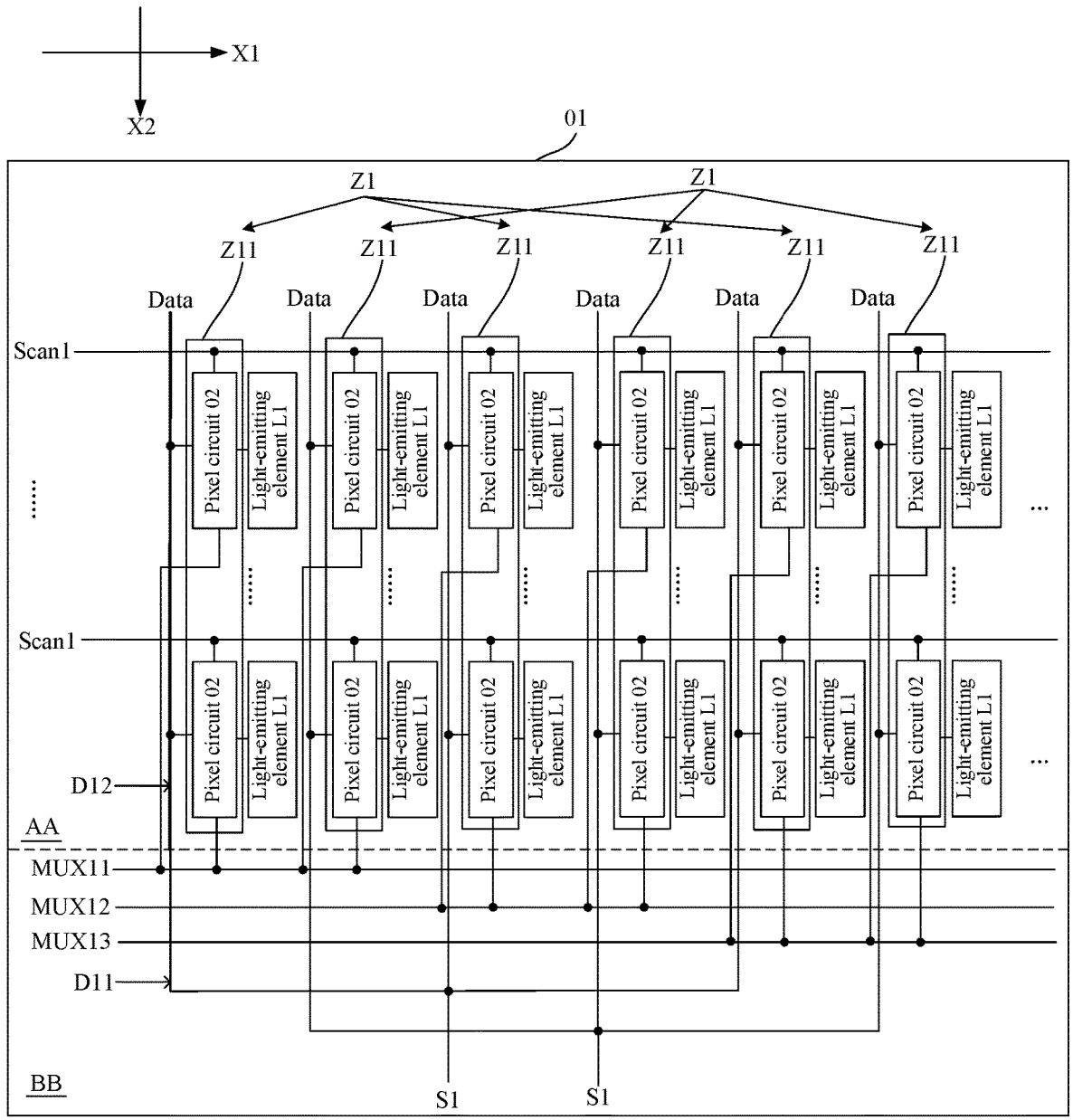
FIG. 4 is a schematic diagram of a structure of still another display substrate according to some embodiments of the present disclosure.

In some other embodiments, it is known from still another display substrate shown in FIG. 4 that non-adjacent columns of pixel circuits 02 (e.g., the first column of pixel circuits 02, the third column of pixel circuits 02, and the fifth column of pixel circuits 02) also belong to one pixel circuit group Z1 and share the same data line S1.

In some embodiments of the present disclosure, the number of pixel circuit subgroups Z11 included in each pixel circuit group Z1 is greater than or equal to 2 and less than or equal to 5. That is, each pixel circuit group Z1 includes two to five columns of pixel circuits 02.

For example, referring to FIG. 3 and FIG. 4, each pixel circuit group Z1 shown includes three pixel circuit subgroups Z11, i.e., three columns of pixel circuits 02. On this basis, it is regarded that every three columns of pixel circuits 02 share one data line S1, and every three adjacent columns of pixel circuits 02 share one data line S1. That is, an MUX circuit architecture of 1:3 (which is interpreted as: every three columns of pixel circuits 02 being coupled to one data line S1 through three data signal lines Data) is employed. In some other embodiments, each pixel circuit group Z1 also includes more columns (e.g., six columns) of pixel circuits 02.

In different pixel circuit groups Z1 according to some embodiment of the present disclosure, at least two pixel circuit subgroups Z11 share one switching control line MUX1 of the plurality of switching control lines MUX1.

For example, it is seen from FIG. 3 and FIG. 4 that among the plurality of pixel circuit groups Z1 included in the display substrate, the plurality of pixel circuit subgroups Z11 included in each of the plurality of pixel circuit groups Z1 share the plurality of switching control lines MUX1 included in the display substrate. For example, the display substrate includes a total of three switching control lines MUX1 on the basis that the three pixel circuit subgroups Z11 (i.e., every three columns of pixel circuits 02) included in each pixel circuit group Z1 share one data line S1. The three switching control lines MUX1 are distinguished by denoting by MUX11, MUX12, and MUX13 respectively in FIG. 3 and FIG. 4. In some embodiments, the three switching control lines MUX11, MUX12, and MUX13 provide switching control signals in different periods of time. Thus, the routing is further simplified, the cost is further reduced, and the narrow border design of a display apparatus is facilitated.

It is seen in FIG. 1, FIG. 3, and FIG. 4 that in the display substrate according to some embodiments of the present disclosure, the display region AA and non-display region BB of the substrate 01 are arranged in the first direction X1.

In some embodiments, the plurality of switching control lines MUX1 and the plurality of first scanning lines Scan1 extend in the first direction X1.

In some embodiments, the plurality of data signal lines Data and the plurality of data lines S1 extend in the second direction X2.

Moreover, in some embodiments, each data signal line Data includes a first segment D11 disposed in the non-display region BB and a second segment D12 disposed in the display region AA. The first segment D11 is coupled to the data line S1 and the second segment D12, and the second segment D12 is further coupled to the pixel circuit 02. That is, the second segment D12 coupled to the pixel circuits 02 is indirectly coupled to the data line S1 through the first segment D11 disposed in the non-display region BB. Based on this, the first segment D11 is also referred to as a data line lead.

In addition, it is seen in FIG. 3 and FIG. 4 that the first segment D11 included in the data signal line Data inevitably intersects the switching control lines MUX1 due to the difference of the directions in which the signal lines extend. Based on this, in some embodiments, signal crosstalk between the two is avoided by disposing the first segment D11 and the switching control lines MUX1 at different layers, that is, the first segment D11 and the switching control lines MUX1 are made of metals disposed at different layers.

Figure 5:
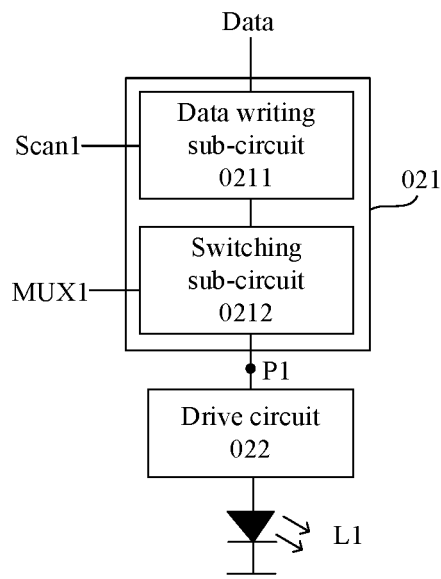
FIG. 5 is a schematic diagram of a structure of another pixel circuit according to some embodiments of the present disclosure.

FIG. 5 is a schematic diagram of a structure of another pixel circuit according to some embodiments of the present disclosure. It is seen in FIG. 5 that the data writing circuit 021 includes a data writing sub-circuit 0211 and a switching sub-circuit 0212 in some embodiments of present disclosure.

In some embodiments, the data writing sub-circuit 0211 is coupled to the first scanning line Scan1, the data signal line Data, and the switching sub-circuit 0212, and the data writing sub-circuit 0211 is configured to control connection and disconnection between the data signal line Data and the switching sub-circuit 0212 in response to the first scanning signal.

For example, the data writing sub-circuit 0211 controls the connection of the data signal line Data to the switching sub-circuit 0212 in a case that the potential of the first scanning signal is the first potential. In this case, the data signal received by the data signal line Data from the data line S1 is transmitted to the switching sub-circuit 0212. The data writing sub-circuit 0211 controls the decoupling of the data signal line Data from the switching sub-circuit 0212 in a case that the potential of the first scanning signal is the second potential. In this case, the data signal is not transmitted to the switching sub-circuit 0212.

In some embodiments, the switching sub-circuit 0212 is further coupled to the switching control line MUX1 and the drive circuit 022 (i.e., the first node P1 in FIG. 5), and the switching sub-circuit 0212 is configured to control connection and disconnection between the data writing sub-circuit 0211 and the drive circuit 022 in response to the switching control signal.

For example, the switching sub-circuit 0212 controls the connection of the data writing sub-circuit 0211 to the drive circuit 022 in a case that the potential of the switching control signal is the first potential. In this case, the data signal transmitted from the data writing sub-circuit 0211 to the switching sub-circuit 0212 is further transmitted to the drive circuit 022. The switching sub-circuit 0212 controls the decoupling of the data writing sub-circuit 0211 from the drive circuit 022 in a case that the potential of the switching control signal is the second potential. In this case, the data signal is not further transmitted to the drive circuit 022.

In some embodiments, the data writing sub-circuit 0211 and the switching sub-circuit 0212 satisfy other coupling modes. For example, the switching sub-circuit 0212 is coupled to the first scanning line Scan1, the data signal line Data, and the data writing sub-circuit 0211, and the data writing sub-circuit 0211 is further coupled to the switching control line MUX1 and the drive circuit 022. Alternatively, the switching sub-circuit 0212 is coupled to the first scanning line Scan1, the switching control line MUX1, and the data writing sub-circuit 0211, and transmits the first scanning signal to the data writing sub-circuit 0211 in response to the switching control signal. The data writing sub-circuit 0211 is further coupled to the data signal line Data and the drive circuit 022, and transmits a data signal to the drive circuit 022 in response to the first scanning signal. The embodiments of the present disclosure do not limit the coupling mode and control rationale of the data writing sub-circuit 0211 and the switching sub-circuit 0212.

Figure 6:
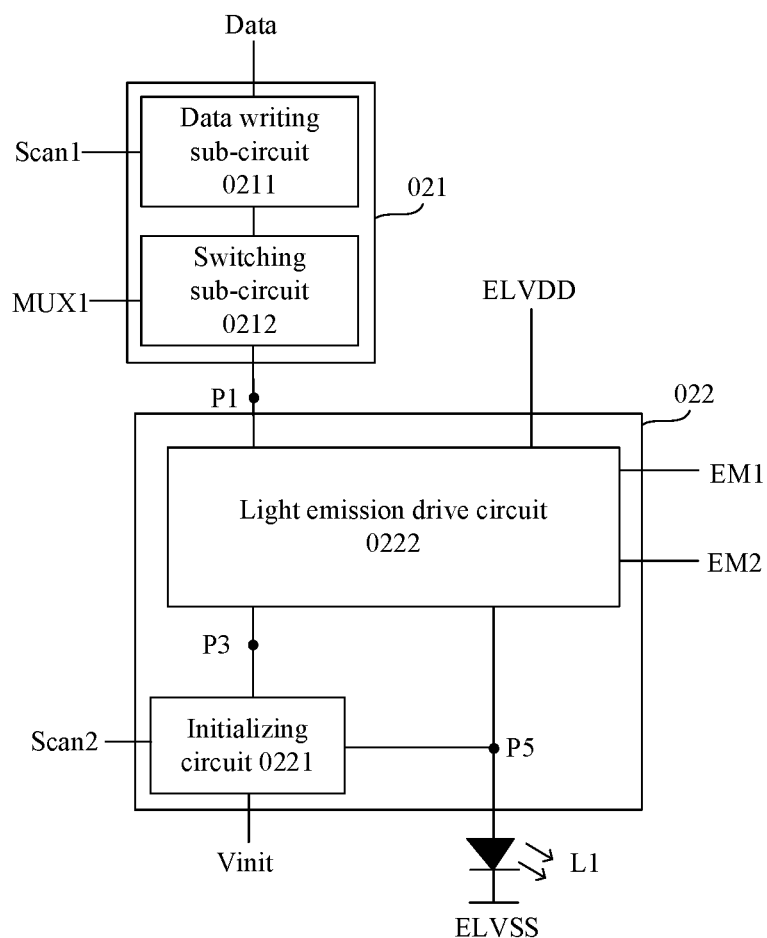
FIG. 6 is a schematic diagram of a structure of still another pixel circuit according to some embodiments of the present disclosure.

FIG. 6 is a schematic diagram of a structure of a still another pixel circuit according to some embodiments of the present disclosure. It is known from FIG. 1 and FIG. 6 that the display substrate in some embodiments further includes: a plurality of first light emission control lines EM1, a plurality of second light emission control lines EM2, a plurality of second scanning lines Scan2, a plurality of initializing signal lines Vinit, and a plurality of first power lines ELVDD, wherein the plurality of first light emission control lines EM1, the plurality of second light emission control lines EM2, the plurality of second scanning lines Scan2, the plurality of initializing signal lines Vinit, and the plurality of first power lines ELVDD are disposed in the display region AA and the non-display region BB. The plurality of first light emission control lines EM1, the plurality of second light emission control lines EM2, the plurality of second scanning lines Scan2, the plurality of initializing signal lines Vinit, and the plurality of first power lines ELVDD are coupled to the plurality of pixel circuit subgroups Z11 in the plurality of pixel circuit groups Z1. Moreover, the drive circuit 022 includes: an initializing circuit 0221 and a light emission drive circuit 0222.

In some embodiments, the initializing circuit 0221 is coupled to the second scanning line Scan2, the initializing signal line Vinit, the light emission drive circuit 0222, and a first electrode of the light-emitting element L1. The initializing circuit 0221 is configured to control, in response to a second scanning signal provided by the second scanning line Scan2, connection and disconnection between the initializing signal line Vinit and the light emission drive circuit 0222 and connection and disconnection between the initializing signal line Vinit and the first electrode of the light-emitting element L1. In FIG. 6, the coupling node between the initializing circuit 0221 and the light emission drive circuit 0222 is denoted by the third node P3, and the coupling node between the initializing circuit 0221 and the first electrode of the light-emitting element L1 is denoted by the fifth node P5.

For example, the initializing circuit 0221 controls the connection of the initializing signal line Vinit to both the third node P3 and the fifth node P5 in a case that the potential of the second scanning signal provided by the second scanning line Scan2 is the first potential. In this case, the initializing signal line Vinit resets the third node P3 and the fifth node P5 by transmitting an initializing signal to the third node P3 and the fifth node P5. The initializing circuit 0221 controls the decoupling of the initializing signal line Vinit from both the third node P3 and the fifth node P5 in a case that the potential of the second scanning signal is the second potential. In this case, the initializing signal line Vinit is unable to transmit the initializing signal to the third node P3 and the fifth node P5.

The light emission drive circuit 0222 is further coupled to the data writing circuit 021 (i.e., the first node P1), the first power line ELVDD, the first light emission control line EM1, the second light emission control line EM2, and the first electrode (i.e., the fifth node P5) of the light-emitting element L1. The light emission drive circuit 0222 is configured to transmit a light emission driving signal (e.g., driving current) to the first electrode of the light-emitting element L1 in response to a data signal provided by the data writing circuit 021, a first light emission control signal provided by the first light emission control line EM1, a second light emission control signal provided by the second light emission control line EM2, and a first power signal provided by the first power line ELVDD.

In some embodiments, the second electrode of the light-emitting element L1 is configured to be coupled to the second power line ELVSS, and the light-emitting element L1 is configured to emit light based on the light emission driving signal transmitted by the light emission drive circuit 0222 and the second power signal provided by the second power line ELVSS. For example, the light-emitting element L1 emits light under a voltage difference between the light emission driving signal and the second power signal. Based on this, it is also determined that besides the above signal lines, the display substrate further includes a second power line ELVSS for connection with the second electrode of the light-emitting element L1 in some embodiments.

In some embodiments, referring to FIG. 6, the first electrode of the light-emitting element L1 is an anode, and correspondingly, the second electrode of the light-emitting element L1 is a cathode. Alternatively, in some other embodiments, the first electrode of the light-emitting element L1 is a cathode, and correspondingly, the second electrode of the light-emitting element L1 is an anode.

In the embodiments of the present disclosure, the potential of the first power signal is greater than that of the second power signal. For example, the potential of the first power signal is a positive potential (i.e., greater than 0), the potential of the second power signal is a negative potential (i.e., less than 0), and the potential of the initializing signal is a negative potential.

Figure 7:
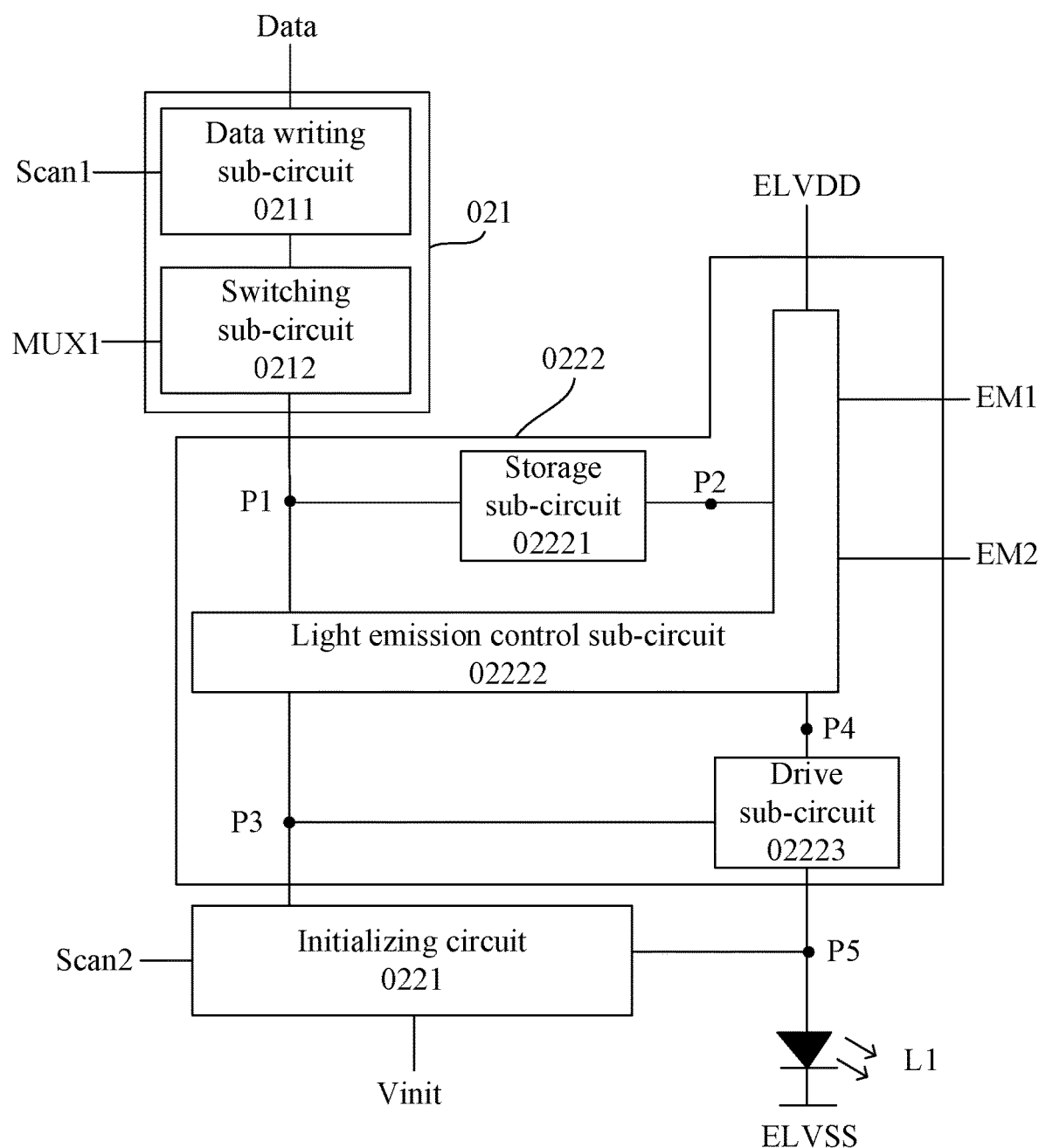
FIG. 7 is a schematic diagram of a structure of yet still another pixel circuit according to some embodiments of the present disclosure.

FIG. 7 is a schematic diagram of a structure of another pixel circuit according to some embodiments of the present disclosure. As shown in FIG. 7, the light emission drive circuit 0222 in some embodiments includes: a storage sub-circuit 02221, a light emission control sub-circuit 02222, and a drive sub-circuit 02223.

The storage sub-circuit 02221 is coupled to the data writing circuit 021 and the light emission control sub-circuit 02222, and the storage sub-circuit 02221 is configured to regulate potentials at a coupling node. In FIG. 7, the coupling node between the storage sub-circuit 02221 and the data writing circuit 021 is denoted by the first node P1, and the coupling node between the storage sub-circuit 02221 and the light emission control sub-circuit 02222 is denoted by the second node P2. That is, in the embodiments of the present disclosure, the storage sub-circuit 02221 is configured to regulate the potential at the first node P1 and the potential at the second node P2.

In some embodiments, the light emission control sub-circuit 02222 is further coupled to the first light emission control line EM1, the second light emission control line EM2, the first power line ELVDD, the data writing circuit 021, and the drive sub-circuit 02223. The light emission control sub-circuit 02222 is configured to control connection and disconnection between the first power line ELVDD and the drive sub-circuit 02223 in response to the first light emission control signal and the second light emission control signal. In FIG. 7, the coupling node between the light emission control sub-circuit 02222 and the data writing circuit 021 is denoted by the first node P1, and the coupling nodes between the light emission control sub-circuit 02222 and the drive sub-circuit 02223 are denoted by the third node P3 and the fourth node P4 respectively. It is known from the coupling mode of the initializing circuit 0221 in the above embodiments that the light emission control sub-circuit 02222 is further coupled to the initializing circuit 0221 through the third node P3 in some embodiments.

For example, the light emission control sub-circuit 02222 controls the connection of the first power line ELVDD to the second node P2 and the connection of the first node P1 to the third node P3 in a case that the potential of the first light emission control signal is the first potential. In this case, the first power line ELVDD transmits the first power signal to the second node P2, and the potential of the first node P1 and the potential of the third node P3 affect each other, that is, the potential of the first node P1 is transmitted to the third node P3. The light emission control sub-circuit 02222 controls the decoupling of the first power line ELVDD from the second node P2 and the decoupling of the first node P1 from the third node P3 in a case that the potential of the first light emission control signal is the second potential. In this case, the first power line ELVDD is unable to transmit the first power signal to the second node P2, and the potential of the first node P1 and the potential of the third node P3 are independent of each other. For example, the potential of the first node P1 is not transmitted to the third node P3.

Similarly, the light emission control sub-circuit 02222 controls the connection of the second node P2 to the fourth node P4 in a case that the potential of the second light emission control signal is the first potential. In this case, the potential of the second node P2 and the potential of the fourth node P4 affect each other. For example, the potential of the second node P2 is transmitted to the fourth node P4. The light emission control sub-circuit 02222 controls the decoupling of the second node P2 from the fourth node P4 in a case that the potential of the second light emission control signal is the second potential. In this case, the potential of the second node P2 and the potential of the fourth node P4 are independent of each other. For example, the potential of the second node P2 is not transmitted to the fourth node P4.

The drive sub-circuit 02223 is further coupled to the first electrode (i.e., the fifth node P5) of the light-emitting element L1, and the drive sub-circuit 02223 is configured to transmit a light emission driving signal to the first electrode of the light-emitting element L1 in response to a signal provided by the light emission control sub-circuit 02222. That is, referring to FIG. 7, the drive sub-circuit 02223 transmits the light emission driving signal to the fifth node P5 based on the potential of the third node P3 and the potential of the fourth node P4.

Figure 8:
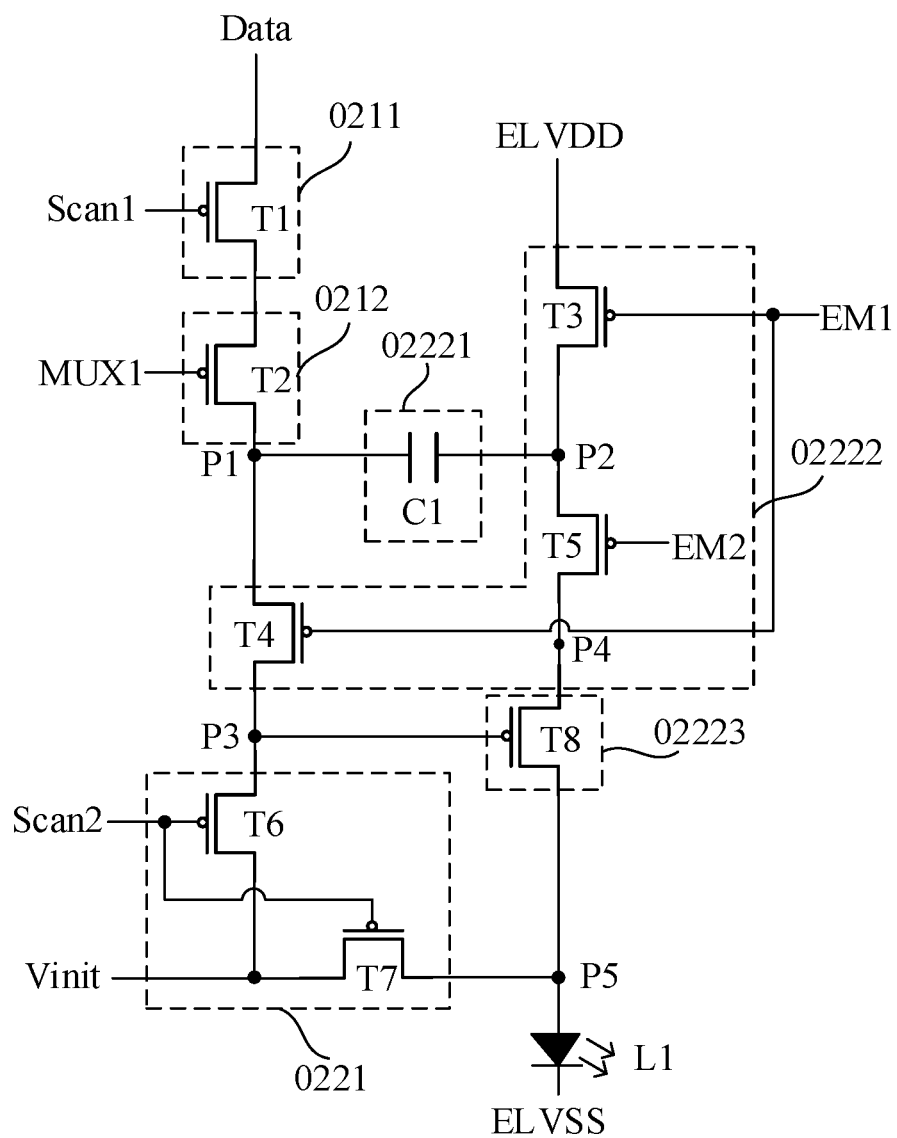
FIG. 8 is a schematic diagram of a structure of yet still another pixel circuit according to some embodiments of the present disclosure.

FIG. 8 is a schematic diagram of a structure of yet still another pixel circuit according to some embodiments of the present disclosure. As shown in FIG. 8, the data writing sub-circuit 0211 in some embodiments includes: a data writing transistor T1. The switching sub-circuit 0212 includes: a switching transistor T2. The light emission control sub-circuit 02222 includes: a first light emission control transistor T3, a second light emission control transistor T4, and a third light emission control transistor T5. The initializing circuit 0221 includes: a first initializing transistor T6 and a second initializing transistor T7. The drive sub-circuit 02223 includes: a drive transistor T8. The storage sub-circuit 02221 includes: a storage capacitor C1.

In some embodiments, a gate of the data writing transistor T1 is coupled to the first scanning line Scan1, a first electrode of the data writing transistor T1 is coupled to the data signal line Data, and a second electrode of the data writing transistor T1 is coupled to the switching sub-circuit 0212.

A gate of the switching transistor T2 is coupled to the switching control line MUX1, a first electrode of the switching transistor T2 is coupled to the data writing circuit 0211, and a second electrode of the switching transistor T2 is coupled to the drive circuit 022 (i.e., the first node P1 in FIG. 8).

In other words, referring to FIG. 8, the second electrode of the data writing transistor T1 being coupled to the switching sub-circuit 0212 and the first electrode of the switching transistor T2 being coupled to the data writing circuit 0211 refer to: the first electrode of the switching transistor T2 being coupled to the second electrode of the data writing transistor T1.

In some embodiments, a gate of the first light emission control transistor T3 is coupled to the first light emission control line EM1, a first electrode of the first light emission control transistor T3 is coupled to the first power line ELVDD, and a second electrode of the first light emission control transistor T3 is coupled to a first electrode of the third light emission control transistor T3 (i.e., the second node P2 in FIG. 8).

A gate of the second light emission control transistor T4 is coupled to the first light emission control line EM1, a first electrode of the second light emission control transistor T4 is coupled to the data writing circuit 021 (i.e., the first node P1 in FIG. 8), and a second electrode of the second light emission control transistor T4 is coupled to the drive sub-circuit 02223 and the initializing circuit 0221 (i.e., the third node P3 in FIG. 8).

A gate of the third light emission control transistor T5 is coupled to the second light emission control line EM2, and a second electrode of the third light emission control transistor T5 is coupled to the drive sub-circuit 02223 (i.e., the fourth node P4 in FIG. 8).

In some embodiments, a gate of the first initializing transistor T6 and a gate of the second initializing transistor T7 are coupled to the second scanning line Scan2. A first electrode of the first initializing transistor T6 and a first electrode of the second initializing transistor T7 are coupled to the initializing signal line Vinit. A second electrode of the first initializing transistor T6 is coupled to the light emission drive circuit 0222 (i.e., the third node P3 in FIG. 8). A second electrode of the second initializing transistor T7 is coupled to the first electrode of the light-emitting element L1 (i.e., the fifth node P5 in FIG. 8).

In some embodiments, a first terminal of the storage capacitor C1 is coupled to the data writing circuit 021 (i.e., the first node P1 in FIG. 8), and a second terminal of the storage capacitor C1 is coupled to the light emission control sub-circuit 02222 (i.e., the second node P2 in FIG. 8).

In some embodiments, a gate of the drive transistor T8 is coupled to the light emission control sub-circuit 02222 and the initializing circuit 0221 (i.e., the third node P3 in FIG. 8), a first electrode of the drive transistor T8 is coupled to the light emission control sub-circuit 02222 (i.e., the fourth node P4 in FIG. 8), and a second electrode of the drive transistor T8 is coupled to the first electrode of the light-emitting element L1 (i.e., the fifth node P5 in FIG. 8).

It is noted that the pixel circuit 02 in some embodiments of the present disclosure has a structure other than the 8T1C (that is, including 8 transistors and 1 capacitor) shown in FIG. 8, provided that the above functions are satisfied. For example, it is of a 6T1C structure. The 6T1C structure at least includes: the data writing transistor T1 and the switching transistor T2 shown in FIG. 8.

It is also noted that in the pixel circuit 02 in some embodiments of the present disclosure, the transistors are P-type transistors, and accordingly, the first potential is a lower potential relative to the second potential as described in the above examples. In some other embodiments, the transistors are N-type transistors, and accordingly, the first potential is a higher potential relative to the second potential. Alternatively, each pixel circuit includes both N-type transistors and P-type transistors. In some embodiments, the material of the N-type transistor is an oxide material, and the material of the P-type transistor is a low temperature polysilicon (LTPS) material. A display panel including N-type transistors and P-type transistors is referred to as a low temperature polycrystalline oxide (LTPO) display panel. The material of a transistor generally refers to the material of the active layer in the transistor.

Figure 9:
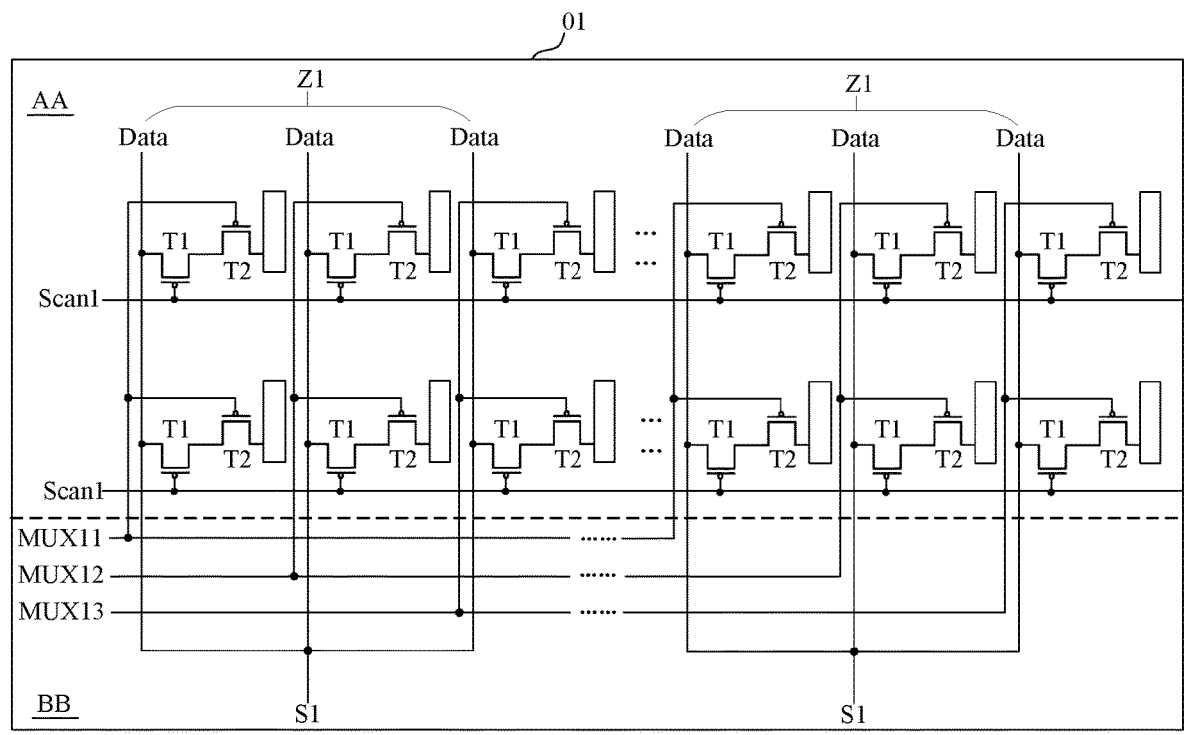
FIG. 9 is a schematic diagram of a structure of still another display substrate according to some embodiments of the present disclosure.

Taking the structures shown in FIG. 3 and FIG. 8 as examples, FIG. 9 shows a structure of still another display substrate. In FIG. 9, the data writing transistor T1 and the switching transistor T2 are illustrated, and other structures than the data writing transistor T1 and the switching transistor T2 in each pixel circuit 02 are represented by "rectangular blocks". The switching transistor T2 is regarded as an MUX circuit portion integrated in the pixel circuit 02.

Figure 10:
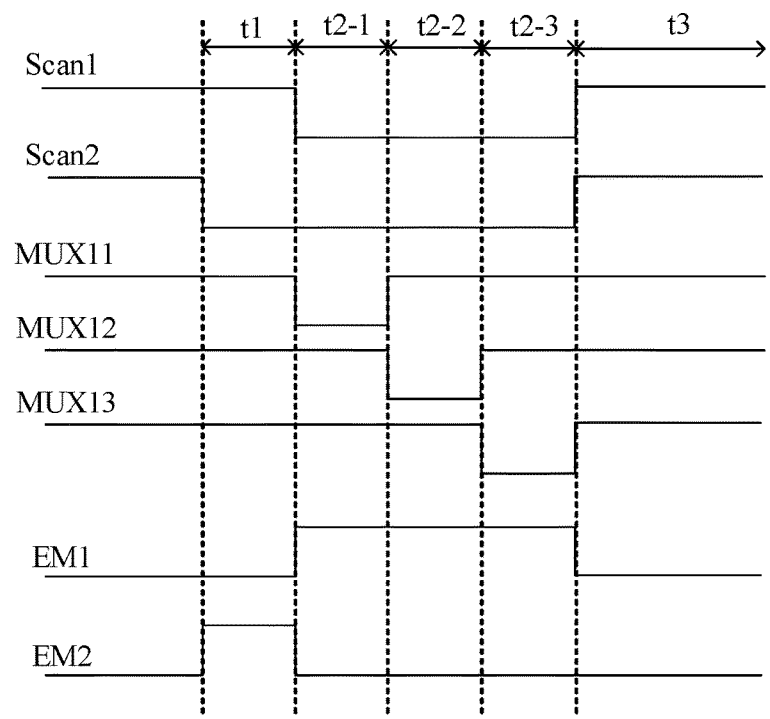
FIG. 10 is a timing diagram of signal terminals in a pixel circuit according to some embodiments of the present disclosure.

Taking the structures shown in FIG. 3 and FIG. 8 where all the transistors in the pixel circuit are P-type transistors and the first potential is a lower potential relative to the second potential as examples, the driving principle of the pixel circuit in the embodiments of the present disclosure is described as follows. FIG. 10 is a timing diagram of signal terminals in a pixel circuit according to some embodiments of the present disclosure. As shown in FIG. 10, the whole process includes: an initialization stage t1, a data writing stage t2, and a light emission stage t3.

At the initialization stage t1, the potential of the first scanning signal provided by the first scanning line Scan1, the potential of the switching control signal provided by the switching control line MUX1, and the potential of the second light emission control signal provided by the second light emission control line EM2 are all the second potential (i.e., higher potential). The potential of the second scanning signal provided by the second scanning line Scan2 and the potential of the first light emission control signal provided by the first light emission control line EM1 are both the first potential (i.e., lower potential). In this way, the data writing transistor T1, the switching transistor T2, and the third light emission control transistor T5 are all turned off, and the first initializing transistor T6, the second initializing transistor T7, the first light emission control transistor T3, and the second light emission control transistor T4 are all turned on. Accordingly, the initializing signal provided by the initializing signal line Vinit is transmitted to the third node P3 through the first initializing transistor T6 and the initializing signal is transmitted to the first electrode of the light-emitting element L1 through the second initializing transistor T7, thereby implementing initialization (i.e., reset) of the third node P3 and the first electrode of the light-emitting element L1. Since the third node P3 is coupled to the gate of the drive transistor T8, reset of the gate of the drive transistor T8 is thereby implemented, and the drive transistor T8 is turned on. Reset is also referred to as voltage reset. The first power signal provided by the first power line ELVDD is transmitted to the second node P2 through the first light emission control transistor T3, and the initializing signal transmitted to the third node P3 is transmitted to the first node P1 through the second light emission control transistor T4.

In some embodiments, the initializing signal is at a lower potential, and the first power signal is at a higher potential. Assuming that the potential of the initializing signal is Vinit0 and the potential of the first power signal is Elvdd, referring to the following Table 1, at the initialization stage t1, the potential Vp1 of the first node P1, the potential Vp3 of the third node P3, and the potential Vp5 of the fifth node P5 are all Vinit0. The potential Vp2 of the second node P2 is Elvdd.

TABLE 1

|  | P1 (Vp1) | P2 (Vp2) | P3 (Vp3) | P5 (Vp5) |
|---|---|---|---|---|
| Stage t1 | Vinit0 | Elvdd | Vinit0 | Vinit0 |

Taking the pixel circuit 02 coupled to MUX11 as an example, at the data writing stage t2, the potential of the first scanning signal provided by the first scanning line Scan1 coupled thereto, the potential of the second scanning signal provided by the second scanning line Scan2, the potential of the second light emission control signal provided by the second light emission control line EM2, and the potential of the switching control signal provided by the switching control line MUX11 are all the first potential. Only the potential of the first light emission control signal provided by the first light emission control line EM1 is the second potential. In this way, the data writing transistor T1, the switching transistor T2, the third light emission control transistor T5, the first initializing transistor T6, and the second initializing transistor T7 are all turned on, the first light emission control transistor T3 and the second light emission control transistor T4 are both turned off. Accordingly, the data signal provided by the data signal line Data is transmitted to the first node P1 through the data writing transistor T1 and the switching transistor T2. The initializing signal provided by the initializing signal line Vinit is transmitted to the third node P3 through the first initializing transistor T6 and the initializing signal is transmitted to the first electrode of the light-emitting element L1 through the second initializing transistor T7. The potential of the second node P2 is transmitted to the fourth node P4 through the third light emission control transistor T5, i.e., the potential of the fourth node P4 is the same as the potential of the second node P2.

At the data writing stage t2, the potential Vp2 of the second node P2 is first maintained at the potential (i.e., Elvdd) at the initialization stage t1. Since the voltage difference between the first terminal and the second terminal of the storage capacitor C1 cannot change abruptly, in a case that the first node P1 changes from the initializing signal to the data signal, the potential Vp2 of the second node P2 changes to Elvdd−Vinit0+Vdata, wherein Vdata refers to the potential of the data signal. Accordingly, it is determined that the potential Vp4 of the fourth node P4 is also Elvdd−Vinit0+Vdata. Since the third node P3 is coupled to the gate (g) of the drive transistor T8 and the fourth node P4 is coupled to the source (s) of the drive transistor T8, it is determined that, at the data writing stage t2, the gate-source voltage difference Vgs of the drive transistor T8 satisfies:

Vgs=Vg−Vs=Vp3−Vp4=Vinit0−(Elvdd−Vinit0+Vdata)  formula (1);

Since Vinit0 is a lower potential and Elvdd and Vdata are generally higher potentials, it is seen in the above formula (1) that the gate-source voltage difference Vgs of the drive transistor T8 is a lower potential and generally smaller than the threshold voltage Vth of the drive transistor T8. Since Vth is generally a lower potential less than 0 for P-type transistors, it is determined that, at the data writing stage t2, the drive transistor T8 is remained to be turned on until the potential Vp2 of the second node P2 is continuously discharged to Vinit0−Vth, and the drive transistor T8 is turned off.

In some embodiments, in combination with the above embodiments, Table 2 shows the potential Vp1 of the first node P1, the potential Vp2 of the second node P2, the potential Vp3 of the third node P3, and the potential Vp5 of the first electrode of the light-emitting element L1 at the data writing stage t2. Referring to the following Table 2, it is seen that, at the data writing stage t2, the potential Vp1 of the first node P1 is Vdata, the potential Vp2 of the second node P2 is Vinit0−Vth, and the potential Vp3 of the third node P3 and the potential Vp5 of the fifth node P5 are both Vinit0.

TABLE 2

|  | P1 (Vp1) | P2 (Vp2) | P3 (Vp3) | P5 (Vp5) |
|---|---|---|---|---|
| Stage t2 | Vdata | Vinit0-Vth | Vinit0 | Vinit0 |

It should be noted that in FIG. 10, the data writing stage t2 of the pixel circuit 02 coupled to the switching control line MUX11 is denoted by t2-1, the data writing stage t2 of the pixel circuit 02 coupled to the switching control line MUX12 is denoted by t2-2, and the data writing stage t2 of the pixel circuit 02 coupled to the switching control line MUX13 is denoted by t2-3. Referring to FIG. 10, at stage t2-1, the switching control line MUX11 provides a switching control signal of the first potential and both the switching control line MUX12 and the switching control line MUX13 provide a switching control signal of the second potential. At stage t2-2, the switching control line MUX12 provides a switching control signal of the first potential and both the switching control line MUX11 and the switching control line MUX13 provide a switching control signal of the second potential. At stage t2-3, the switching control line MUX13 provides a switching control signal of the first potential and both the switching control line MUX11 and the switching control line MUX12 provide a switching control signal of the second potential. That is, from stage t2-1 to stage t2-3, the switching control lines MUX11, MUX12, and MUX13 sequentially provide switching control signals of the active potential at different time. In this way, the data signals provided by one data line S1 are transmitted to the drive circuit 022 included in each pixel circuit 02 at different time through the data signal line Data coupled to the three pixel circuits 02, thereby ensuring that the three light-emitting elements L1 coupled to the three pixel circuits 02 emit light sequentially, not simultaneously.

At the light emission stage (also referred to as the display stage) t3, the potential of the first scanning signal provided by the first scanning line Scan1, the potential of the second scanning signal provided by the second scanning line Scan2, and the potential of the switching control signal provided by the switching control line MUX1 are all the second potential. The potential of the first light emission control signal provided by the first light emission control line EM1 and the potential of the second light emission control signal provided by the second light emission control line EM2 are both the first potential. In this way, the data writing transistor T1, the switching transistor T2, the first initializing transistor T6, and the second initializing transistor T7 are all turned off, and the first light emission control transistor T3, the second light emission control transistor T4, and the third light emission control transistor T5 are all turned on. Accordingly, the first power signal is transmitted to the second node P2 through the first light emission control transistor T3, i.e., the potential Vp2 of the second node P2 is Elvdd. Since the voltage difference between the first terminal and the second terminal of the storage capacitor C1 cannot change abruptly, the potential Vp1 of the first node P1 is Vdata−Vinit0+Vth+Elvdd. The potential Vp1 of the first node P1 is transmitted to the third node P3 through the second light emission control transistor T4, and the potential Vp3 of the third node P3 is the same as the potential Vp1 of the first node P1, i.e., Vdata−Vinit0+Vth+Elvdd. The potential Vp2 of the second node P2 is transmitted to the fourth node P4 through the third light emission control transistor T5, and the potential Vp4 of the fourth node P4 is the same as the potential Vp2 of the second node P2, i.e., Elvdd.

Since the third node P3 is coupled to the gate (g) of the drive transistor T8 and the fourth node P4 is coupled to the source (s) of the drive transistor T8, it is determined that, at the light emission stage t3, the gate-source voltage difference Vgs of the drive transistor T8 satisfies:

$$Vgs=Vg-Vs=Vp3-Vp4=Vdata-Vinit0+Vth+Elvdd-Elvdd=Vdata-Vinit0+Vth \quad \text{formula(2)}$$

Based on the formula (2), it is seen that the gate-source voltage difference Vgs of the drive transistor T8 is greater than the threshold voltage Vth of the drive transistor T8. Accordingly, the drive transistor T8 is turned on, and the drive transistor T8 drives the light-emitting element L1 to emit light by transmitting a driving current to the first electrode of the light-emitting element L1 based on the potential Vp3 of the third node P3 and the potential Vp4 of the fourth node P4.

In some embodiments, in combination with the above embodiments, Table 3 shows the potential Vp1 of the first node P1, the potential Vp2 of the second node P2, and the potential Vp3 of the third node P3 at the light emission stage t3. Referring to the following Table 3, it is seen that at the light emission stage t3, the potential Vp1 of the first node P1 and the potential Vp3 of the third node P3 are both Vdata−Vinit0+Vth+Elvdd, and the potential Vp2 of the second node P2 is Elvdd.

TABLE 3

|  | P1 (Vp1) | P2 (Vp2) | P3 (Vp3) |
| --- | --- | --- | --- |
| Stage t3 | Vdata − Vinit0 + Vth + Elvdd | Elvdd | Vdata − Vinit0 + Vth + Elvdd |

Based on the drive current formula: $I_0=k*(Vgs-Vth)^2$, it is noted that in the embodiments of the present disclosure, the driving current $I_0$ generated by the drive transistor T8 satisfies:

$$I_0=k*[(Vdata-Vinit0+Vth)-Vth]^2=k*(Vdata-Vinit0)^2 \quad \text{formula (3)}$$

wherein $k=1/2*Cox*\mu W/L$, Cox refers to the channel capacitance per unit area of the drive transistor T8, W/L refers to the width-to-length ratio of the drive transistor T8, and μ refers to the channel mobility of the drive transistor T8. It is seen that k is dependent on the properties of the drive transistor T8 itself. Furthermore, it is confirmed that the magnitude of the driving current $I_0$ generated by the drive transistor T8 is merely related to the data signal provided by the data signal line Data and the initializing signal provided by the initializing signal line Vinit, but not related to the threshold voltage Vth of the drive transistor T8. Accordingly, the driving current transmitted to the light-emitting element L1 is not affected by the shift of the threshold voltage Vth of the drive transistor T8. Since the initializing signal line Vinit is merely an initialization reference power source and does not need to generate a light emission current for driving the light-emitting element L1 to emit light, the current of the signal line (i.e., Vinit line) coupled to the initializing signal line Vinit is substantially 0, and the voltage drop (IR) across the Vinit line is small and thus has almost no influence on the driving current. Therefore, the pixel circuit provided in the embodiments of the present disclosure compensates for the threshold voltage Vth and the IR drop at the same time, and effectively improves the problem of poor display uniformity caused by the threshold voltage Vth shift or the IR voltage drop. The data writing stage t2 is also referred to as the data writing compensation stage.

Moreover, taking the 1:3 MUX circuit architecture as an example, FIG. 11 shows a schematic diagram of a structure of a display substrate in other practices. Referring to FIG. 11, in the display region AA, each pixel circuit 02 includes only the data writing transistor T1 coupled to the data signal line Data and the first scanning line Scan1. The switching transistor T2 is provided in the non-display region BB. Each switching transistor T2 is coupled to one switching control line MUX1, one data line S1, and one data signal lines Data, and transmits a data signal from the data line S1 to the data signal line Data in response to a switching control signal. A plurality of switching transistors T2 (e.g., three switching transistors T2) share one data line S1. However, referring to FIG. 11, a parasitic capacitance C0 inevitably exists in each data signal line Data, and the parasitic capacitance C0 causes a difference between the potentials of the data signal transmitted to the data signal lines Data sharing the data line S1 in a case that each data line S1 cooperates with the switching transistor T2.

Taking FIG. 11 in which the three data signal lines Data1, Data2, and Data3 are coupled to one data line S1 through three switching transistors T2 and the three switching transistors T2 are coupled to three switching control lines MUX11, MUX12, and MUX13 respectively as an example, in combination with the timing diagram shown in FIG. 10, after a hop from stage t2-1 to stage t2-2, that is, at stage t2-2, due to the existence of the parasitic capacitance C0, even if the switching control line MUX11 provides a switching control signal of a non-active potential, the data signal stored on the parasitic capacitance C0 will be transmitted to the pixel circuit 02 coupled to the data signal line Data1 through the data signal line Data1. That is, while a data signal is written into the pixel circuit 02 coupled to the data signal line Data2, a data signal is also mis-written into the pixel circuit 02 coupled to the data signal line Data1. After a hop from stage t2-2 to stage t2-3, that is, at stage t2-3, due to the existence of the parasitic capacitance C0, even if both switching control lines MUX11 and MUX12 provide switching control signals of non-active potentials, the data signal stored on the parasitic capacitance C0 will be transmitted to the pixel circuit 02 coupled to the data signal line Data1 through the data signal line Data1 and transmitted to the pixel circuit 02 coupled to the data signal line Data2 through the data signal line Data2. That is, while a data signal is written into the pixel circuit 02 coupled to the data signal line Data3, a data signal is also mis-written into the pixel circuit 02 coupled to the data signal line Data1 and the pixel circuit 02 coupled to the data signal line Data2.

Furthermore, it is seen that the durations for transmitting data signals to the three data signal lines Data1, Data2, and Data3 sharing one data line S1 through the data line S1 are different, that is, the charging durations of the pixel circuits 02 coupled to the three data signal lines Data1, Data2, and Data3 are different. Accordingly, the luminance of the light-emitting elements L1 coupled to the pixel circuits 02 are different, which results in poor display uniformity of the display substrate.

Referring to FIG. 10, in a case that the display substrate provided in the embodiments of the present disclosure is employed, the switching transistor T2 is integrated in each pixel circuit 02, thus avoiding the influence of the parasitic capacitance C0 on the data signal line Data on the charging duration of each pixel circuit 02. That is, the charging durations for each pixel circuits 02 sharing one data line S1 are the same. Taking stage t2-2 as an example, referring to FIG. 8 and FIG. 9, although the parasitic capacitance C0 still exists on the data signal line Data, since the switching control signal provided by the switching control line MUX11 hops to a non-active potential, the switching transistor T2 included in the data writing circuit 021 coupled to the switching control line MUX11 in the pixel circuit 02 is reliably in an off state, and the data signal stored in the parasitic capacitance C0 is not transmitted to the first node P1. It is similar for stage t2-3 and will not be repeated herein.

Therefore, the embodiments of the present disclosure effectively improve the problem of poor display uniformity caused by the MUX circuits in other practices on the basis of simultaneously compensating the threshold voltage Vth and the IR voltage drop. The display substrate provided by the embodiments of the present disclosure has the advantages of good display uniformity and high display image quality.

In summary, the embodiments of the present disclosure provide a display substrate. In the display substrate, a data writing circuit included in each pixel circuit is coupled to a first scanning line, a switching control line, a data signal line, and a drive circuit. The data writing circuit transmits a data signal provided by the data signal line to the drive circuit in response to a first scanning signal provided by the first scanning line and a switching control signal provided by the switching control line, such that the drive circuit drives the coupled light-emitting element to emit light. In the same pixel circuit group, each pixel circuit subgroup is coupled to a different switching control line, and the plurality of data signal lines coupled to each pixel circuit subgroup are coupled to the same data line to receive the data signals from the data line. Thus, each pixel circuit, under the control of the switching control line coupled thereto, receives the data signal provided by the data line for the data signal line coupled thereto. Furthermore, the data signals received by the pixel circuits from the shared data line are consistent, the brightness of light emitted by the light-emitting elements are uniform, and the display uniformity of the display substrate is good.

FIG. 12 is a flowchart of a method for driving a display substrate according to some embodiments of the present disclosure. The method is applicable to drive the display substrate shown in any one of FIG. 1, FIG. 3, FIG. 4, and FIG. 9. Referring to FIG. 12, the method includes 1201.

In 1201, a plurality of switching control lines provide switching control signals in different periods of time; a plurality of first scanning lines provide first scanning signals in different periods of time; and data writing circuits in a plurality of pixel circuits included in the different pixel circuit subgroups control connection of a data signal line to a drive circuit in response to the first scanning signal and the switching control signal at different time, to enable the data signal line to transmit a data signal from a data line to the drive circuit.

A pixel circuit is provided in the embodiments of the present disclosure. In some embodiments, referring to FIG. 2, the pixel circuit 02 includes: a data writing circuit 021 and a drive circuit 022.

The data writing circuit 021 is coupled to a first scanning line Scan1, a switching control line MUX1, a data signal line Data, and the drive circuit 022. The data writing circuit 021 is configured to control connection and disconnection between the data signal line Data and the drive circuit 022 in response to a first scanning signal provided by the first scanning line Scan1 and a switching control signal provided by the switching control line MUX1.

The drive circuit 022 is further coupled to a light-emitting element L1. The drive circuit 022 is configured to drive the light-emitting element L1 to emit light in response to a data signal provided by the data writing circuit 021.

In some embodiments, referring to FIG. 5, the data writing circuit 021 includes: a data writing sub-circuit 0211 and a switching sub-circuit 0212.

The data writing sub-circuit 0211 is coupled with the first scanning line Scan1, the data signal line Data, and the switching sub-circuit 0212. The data writing sub-circuit 0211 is configured to control, in response to a first scanning signal, connection and disconnection between the data signal line Data and the switching sub-circuit 0212.

The switching sub-circuit 0212 is further coupled to the switching control line MUX1 and the drive circuit 022. The switching sub-circuit 0212 is configured to control, in response to a switching control signal, connection and disconnection between the data writing sub-circuit 0211 and the drive circuit 022.

In some embodiments, referring to FIG. 6, the display substrate further includes: a plurality of first light emission control lines EM1, a plurality of second light emission control lines EM2, a plurality of second scanning lines Scan2, a plurality of initializing signal lines Vinit, and a plurality of first power lines ELVDD. The plurality of first light emission control lines EM1, the plurality of second light emission control lines EM2, the plurality of second scanning lines Scan2, the plurality of initializing signal lines Vinit, and the plurality of first power lines ELVDD are disposed in the display region AA and the non-display region BB and coupled to the plurality of pixel circuit subgroups Z11 in the plurality of pixel circuit groups Z1. The drive circuit 022 includes: an initializing circuit 0221 and a light emission drive circuit 0222.

The initializing circuit 0221 is coupled to the second scanning line Scan2, the initializing signal line Vinit, the light emission drive circuit 0222, and a first electrode of the light-emitting element L1. The initializing circuit 0221 is configured to control, in response to a second scanning signal provided by the second scanning line Scan2, connection and disconnection between the initializing signal line Vinit and the light emission drive circuit 0222 and the first electrode of the light-emitting element L1.

The light emission drive circuit 0222 is further coupled to the data writing circuit 021, the first power line ELVDD, the first light emission control line EM1, the second light emission control line EM2, and the first electrode of the light-emitting element L1. The light emission drive circuit 0222 is configured to transmit a light emission driving signal to the first electrode of the light-emitting element L1 in response to a data signal provided by the data writing circuit

021, a first light emission control signal provided by the first light emission control line EM1, a second light emission control signal provided by the second light emission control line EM2, and a first power signal provided by the first power line ELVDD.

A second electrode of the light-emitting element L1 is configured to be coupled to a second power line ELVSS, and the light-emitting element L1 is configured to emit light based on the light emission driving signal and a second power signal provided by the second power line ELVSS. Based on this, it is determined that in some embodiments, besides the above signal lines, the display substrate further includes a second power line ELVSS for connection with the second electrode of the light-emitting element L1.

In some embodiments, referring to FIG. 7, the light emission drive circuit 0222 includes: a storage sub-circuit 02221, a light emission control sub-circuit 02222, and a drive sub-circuit 02223.

The storage sub-circuit 02221 is coupled to the data writing circuit 021 and the light emission control sub-circuit 02222. The storage sub-circuit 02221 is configured to regulate the potential at a coupling node.

The light emission control sub-circuit 02222 is further coupled to the first light emission control line EM1, the second light emission control line EM2, the first power line ELVDD, the data writing circuit 021, and the drive sub-circuit 02223. The light emission control sub-circuit 02222 is configured to control, in response to the first light emission control signal and the second light emission control signal, connection and disconnection between the first power line ELVDD and the drive sub-circuit 02223.

The drive sub-circuit 02223 is further coupled to the first electrode of the light-emitting element L1. The drive sub-circuit 02223 is configured to transmit, in response to a signal provided by the light emission control sub-circuit 02222, the light emission driving signal to the first electrode of the light-emitting element L1.

In some embodiments, referring to FIG. 8, the data writing sub-circuit 0211 includes: a data writing transistor T1. A gate of the data writing transistor T1 is coupled to the first scanning line Scan1, a first electrode of the data writing transistor T1 is coupled to the data signal line Data, and a second electrode of the data writing transistor T1 is coupled to the switching sub-circuit 0212.

The switching sub-circuit 0212 includes: a switching transistor T2. A gate of the switching transistor T2 is coupled to the switching control line MUX1, a first electrode of the switching transistor T2 is coupled to the data writing sub-circuit 0211, and a second electrode of the switching transistor T2 is coupled to the drive circuit 022.

In some embodiments, the light emission control sub-circuit 02222 includes: a first light emission control transistor T3, a second light emission control transistor T4, and a third light emission control transistor T5.

A gate of the first light emission control transistor T3 is coupled to the first light emission control line EM1, a first electrode of the first light emission control transistor T3 is coupled to the first power line ELVDD, and a second electrode of the first light emission control transistor T3 is coupled to a first electrode of the third light emission control transistor T5.

A gate of the second light emission control transistor T4 is coupled to the first light emission control line EM1, a first electrode of the second light emission control transistor T4 is coupled to the data writing circuit 021, and a second electrode of the second light emission control transistor T4 is coupled to the drive sub-circuit 02223 and the initializing circuit 0221.

A gate of the third light emission control transistor T5 is coupled to the second light emission control line EM2, and a second electrode of the third light emission control transistor T5 is coupled to the drive sub-circuit 02223.

In some embodiment, the drive sub-circuit 02223 includes: a drive transistor T8.

A gate of the drive transistor T8 is coupled to the light emission control sub-circuit 02222 and the initializing circuit 0221, a first electrode of the drive transistor T8 is coupled to the light emission control sub-circuit 02222, and a second electrode of the drive transistor T8 is coupled to the first electrode of the light-emitting element L1.

In some embodiment, the storage sub-circuit 02221 includes: a storage capacitor C1. A first terminal of the storage capacitor C1 is coupled to the data writing circuit 021, and a second terminal of the storage capacitor C1 is coupled to the light emission control sub-circuit 02222.

In some embodiment, the initializing circuit 0221 includes: a first initializing transistor T6 and a second initializing transistor T7.

A gate of the first initializing transistor T6 and a gate of the second initializing transistor T7 are coupled to the second scanning line Scan2, a first electrode of the first initializing transistor T6 and a first electrode of the second initializing transistor T7 are coupled to the initializing signal line Vinit, a second electrode of the first initializing transistor T6 is coupled to the light emission drive circuit 0222, and a second electrode of the second initializing transistor T7 is coupled to the first electrode of the light-emitting element L1.

It should be noted that, for specific structures and operating principles of each circuit and each sub-circuit in the pixel circuit 02, reference is made to the corresponding contents in the above embodiments of the display substrate, and the details are not repeated herein.

FIG. 13 is a flowchart of a method for driving a pixel circuit according to some embodiments of the present disclosure. The method is applicable to drive the pixel circuit shown in any one of FIG. 2 and FIG. 5 to FIG. 8. Referring to FIG. 13, the method includes 1301 to 1303.

In 1301, at an initialization stage, the potential of the second scanning signal provided by the second scanning line and the potential of the first light emission control signal provided by the first light emission control line are both the first potential; the potential of the first scanning signal provided by the first scanning line, the potential of the switching control signal provided by the switching control line, and the potential of the second light emission control signal provided by the second light emission control line are all the second potential, the initializing circuit controls the connection of the initializing signal line to the third node and the first electrode of the light-emitting element in response to the second scanning signal, to enable the initializing signal line to transmit the initializing signal to the third node and the first electrode of the light-emitting element; the light emission control sub-circuit controls the connection of the first node to the third node and the connection of the first power line to the second node in response to the first light emission control signal, to enable the first power line to transmit the first power signal to the second node.

In 1302, at a data writing stage, the potential of the first scanning signal, the potential of the second scanning signal, the potential of the switching control signal, and the potential of the second light emission control signal provided by the second light emission control line are all the first potential; the potential of the first light emission control signal is the second potential; the initializing circuit controls the connection of the initializing signal line to the third node and the first electrode of the light-emitting element in response to the second scanning signal; the data writing circuit controls the connection of the data signal line to the first node in response to the first scanning signal and the switching control signal, to enable the data signal line to transmit the data signal from the data line to the first node; the light emission control sub-circuit controls the connection of the second node to the fourth node in response to the second light emission control signal.

In 1303, at a light emission stage, the potential of the first light emission control signal and the potential of the second light emission control signal are both the first potential; the potential of the first scanning signal, the potential of the second scanning signal, and the potential of the switching control signal are all the second potential; the light emission control sub-circuit controls, in response to the first light emission control signal, the connection of the first power line to the second node and the connection of the first node to the third node, and controls connection of the second node to the fourth node in response to the second light emission control signal; the drive sub-circuit drives the light-emitting element to emit light by transmitting the light emission driving signal to the first electrode of the light-emitting element based on the potential of the third node and the potential of the fourth node.

It should be noted that, for specific implementation of 1301 to 1303, reference is made to the corresponding contents in the above embodiments of the display substrate, and the details are not repeated herein.

Figure 14:
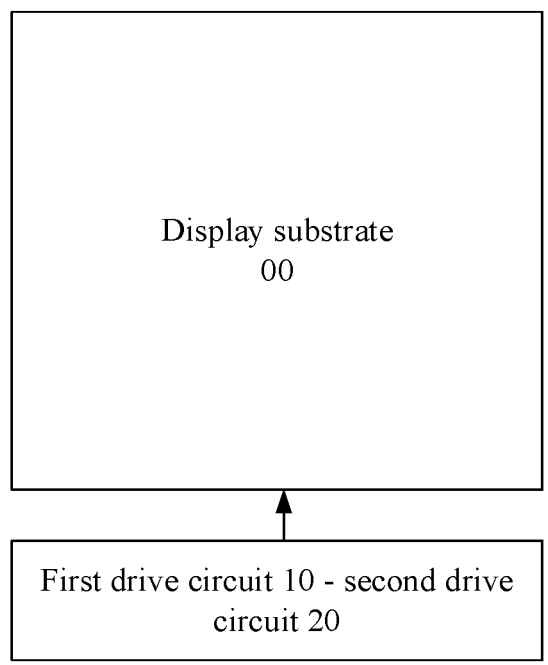
FIG. 14 is a schematic diagram of a structure of a display apparatus according to some embodiments of the present disclosure.

FIG. 14 is a schematic diagram of a structure of a display apparatus according to some embodiments of the present disclosure. As shown in FIG. 14, the display apparatus includes: a first drive circuit 10, a second drive circuit 20, and a display substrate 00 shown in any one of FIG. 1, FIG. 3, FIG. 4, and FIG. 9.

The first drive circuit 10 is coupled to the plurality of switching control lines MUX1 in the display substrate 00, and the first drive circuit 10 is configured to provide a switching control signal for the plurality of switching control lines MUX1. The second drive circuit 20 is coupled to the plurality of data lines Data in the display substrate 00, and the second drive circuit 20 is configured to provide a data signal for the plurality of data lines Data.

In some embodiments, the first drive circuit and the second drive circuit are integrated. For example, the first drive circuit and the second drive circuit are integrated into the driver integrated circuit Driver IC as defined in the above embodiments. Alternatively, the first drive circuit and the second drive circuit are provided independently.

In some embodiments, the display apparatus in the embodiments of the present disclosure is: an OLED display apparatus, an AMOLED device, a mobile phone, a tablet computer, a television, a display, a notebook computer, a digital photo frame or a navigator, or any other products or parts with a display function.

Terms used in detailed description of the present disclosure are defined to merely explain the embodiments of the present disclosure and are not intended to limit of the present disclosure. Unless otherwise defined, technical or scientific terms used in detailed description of the present disclosure have the ordinary meanings as understood by those of ordinary skill in the art to which the present disclosure belongs.

For example, word "first," "second," "third" or the like, which is used in the specification and claims of the present disclosure, is not intended to indicate any order, quantity or importance, but is merely defined to distinguish different components.

Likewise, "a," "an" or other similar words does not indicate a limitation of quantity, but rather the presence of at least one.

"Include," "comprise" or other similar words means that the elements or objects stated before "include" or "comprise" encompass the elements or objects and equivalents thereof listed after "include" or "comprise", but does not exclude other elements or objects.

"Up," "down," "left," "right" or the like is only defined to indicate relative position relationship. In some embodiments, in a case that the absolute position of the described object is changed, the relative position relationship is changed accordingly.

The term "and/or" indicates that three relationships are present. For example, A and/or B indicates that: only A is present, both A and B are present, and only B is present. The symbol "/" usually indicates an "or" relationship between the associated objects.

It is apparent to those skilled in the art that, for convenience and simplicity of description, for specific working processes of the gate drive circuit, the shift register unit, and each circuit and the sub-circuit described above, reference is made to the corresponding processes in the method embodiments, and the details are not repeated herein.

Described above are merely exemplary embodiments of the present disclosure and are not intended to limit the present disclosure. Within the spirit and principle of the present disclosure, any modifications, equivalent substitutions, improvements, and the like are within the protection scope of the present disclosure.

The invention claimed is:

1. A display substrate, comprising:
   a substrate comprising a display region and a non-display region, wherein the display region is surrounded by at least part of the non-display region;
   a plurality of light-emitting elements disposed in the display region;
   a plurality of pixel circuit groups disposed in the display region, at least one of the pixel circuit groups comprising a plurality of pixel circuit subgroups arranged in a first direction, each of the plurality of pixel circuit subgroups comprising a plurality of pixel circuits arranged in a second direction, and the first direction intersecting the second direction;
   a plurality of first scanning lines and a plurality of data signal lines disposed in the display region and the non-display region and coupled to the plurality of pixel circuit subgroups in the plurality of pixel circuit groups; and
   a plurality of switching control lines and a plurality of data lines disposed in the non-display region and coupled to the plurality of pixel circuit subgroups in the plurality of pixel circuit groups;
   wherein at least one of the pixel circuits comprises a data writing circuit and a drive circuit; the data writing circuit being coupled to the first scanning line, the switching control line, the data signal line, and the drive circuit, and the data writing circuit being configured to control, in response to a first scanning signal provided by the first scanning line and a switching control signal provided by the switching control line, connection and disconnection between the data signal line and the drive circuit; the drive circuit being further coupled to the light-emitting element, and the drive circuit being configured to drive the light-emitting element to emit light in response to a data signal provided by the data writing circuit; and the pixel circuits comprised in the same pixel circuit subgroup being coupled to the same switching control line, and the pixel circuits comprised in the same pixel circuit subgroup being coupled to the same data signal line; the plurality of pixel circuit subgroups in the same pixel circuit group being coupled to different switching control lines, and the plurality of data signal lines coupled to the plurality of pixel circuit subgroups in the same pixel circuit group being coupled to the same data line, wherein the plurality of data signal lines are configured to receive a data signal from the data line.

2. The display substrate according to claim 1, wherein at least two pixel circuit subgroups in different pixel circuit groups are configured to share one of the plurality of switching control lines.

3. The display substrate according to claim 2, wherein the plurality of pixel circuit subgroups comprised in each of the plurality of pixel circuit groups are configured to share the plurality of switching control lines.

4. The display substrate according to claim 1, wherein the number of the pixel circuit subgroups comprised in each of the pixel circuit groups is greater than or equal to 2 and is less than or equal to 5.

5. The display substrate according to claim 1, wherein the plurality of switching control lines and the plurality of first scanning lines are configured to extend in the first direction; and the plurality of data signal lines and the plurality of data lines are configured to extend in the second direction.

6. The display substrate according to claim 1, wherein the first direction and the second direction are perpendicular to each other.

7. The display substrate according to claim 1, wherein the plurality of switching control lines are configured to provide switching control signals for data writing circuits of different pixel circuit subgroups in different periods of time.

8. The display substrate according to claim 1, wherein the data writing circuit comprises: a data writing sub-circuit and a switching sub-circuit; wherein the data writing sub-circuit is coupled to the first scanning line, the data signal line, and the switching sub-circuit, and the data writing sub-circuit is configured to control, in response to the first scanning signal, connection and disconnection between the data signal line and the switching sub-circuit; and the switching sub-circuit is further coupled to the switching control line and the drive circuit, and the switching sub-circuit is configured to control, in response to the switching control signal, connection and disconnection between the data writing sub-circuit and the drive circuit.

9. The display substrate according to claim 8, wherein the data writing sub-circuit comprises: a data writing transistor; wherein a gate of the data writing transistor is coupled to the first scanning line, a first electrode of the data writing transistor is coupled to the data signal line, and a second electrode of the data writing transistor is coupled to the switching sub-circuit.

10. The display substrate according to claim 8, wherein the switching sub-circuit comprises: a switching transistor; wherein a gate of the switching transistor is coupled to the switching control line, a first electrode of the switching transistor is coupled to the data writing sub-circuit, and a second electrode of the switching transistor is coupled to the drive circuit.

11. The display substrate according to claim 1, wherein the display substrate further comprises: a plurality of first light emission control lines, a plurality of second light emission control lines, a plurality of second scanning lines, a plurality of initializing signal lines, and a plurality of first power lines, wherein the plurality of first light emission control lines, the plurality of second light emission control lines, the plurality of second scanning lines, the plurality of initializing signal lines, and the plurality of first power lines are disposed in the display region and the non-display region and coupled to the plurality of pixel circuit subgroups in the plurality of pixel circuit groups; the drive circuit comprises: an initializing circuit and a light emission drive circuit; wherein the initializing circuit is coupled to the second scanning line, the initializing signal line, the light emission drive circuit, and a first electrode of the light-emitting element, and the initializing circuit is configured to control, in response to a second scanning signal provided by the second scanning line, connection and disconnection between the initializing signal line and the light emission drive circuit and connection and disconnection between the initializing signal line and the first electrode of the light-emitting element;

the light emission drive circuit is further coupled to the data writing circuit, the first power line, the first light emission control line, the second light emission control line, and the first electrode of the light-emitting element, and the light emission drive circuit is configured to transmit a light emission driving signal to the first electrode of the light-emitting element in response to a data signal provided by the data writing circuit, a first light emission control signal provided by the first light emission control line, a second light emission control signal provided by the second light emission control line, and a first power signal provided by the first power line; and a second electrode of the light-emitting element is coupled to a second power line, and the light-emitting element is configured to emit light in response to the light emission driving signal and a second power signal provided by the second power line.

12. The display substrate according to claim 11, wherein the light emission drive circuit comprises: a storage sub-circuit, a light emission control sub-circuit, and a drive sub-circuit; wherein the storage sub-circuit is coupled to the data writing circuit and the light emission control sub-circuit, and the storage sub-circuit is configured to regulate a potential at a coupling node;

the light emission control sub-circuit is further coupled to the first light emission control line, the second light emission control line, the first power line, the data writing circuit, and the drive sub-circuit, and the light emission control sub-circuit is configured to control, in response to the first light emission control signal and the second light emission control signal, connection and disconnection between the first power line and the drive sub-circuit; and the drive sub-circuit is further coupled to the first electrode of the light-emitting element, and the drive sub-circuit is configured to transmit, in response to a signal provided by the light emission control sub-circuit, a light emission driving signal to the first electrode of the light-emitting element.

13. The display substrate according to claim 12, wherein the light emission control sub-circuit comprises: a first light emission control transistor, a second light emission control transistor, and a third light emission control transistor; wherein
a gate of the first light emission control transistor is coupled to the first light emission control line, a first electrode of the first light emission control transistor is coupled to the first power line, and a second electrode of the first light emission control transistor is coupled to a first electrode of the third light emission control transistor;
a gate of the second light emission control transistor is coupled to the first light emission control line, a first electrode of the second light emission control transistor is coupled to the data writing circuit, and a second electrode of the second light emission control transistor is coupled to the drive sub-circuit and the initializing circuit; and
a gate of the third light emission control transistor is coupled to the second light emission control line, and a second electrode of the third light emission control transistor is coupled to the drive sub-circuit.

14. The display substrate according to claim 12, wherein the drive sub-circuit comprises: a drive transistor; wherein
a gate of the drive transistor is coupled to the light emission control sub-circuit and the initializing circuit, a first electrode of the drive transistor is coupled to the light emission control sub-circuit, and a second electrode of the drive transistor is coupled to the first electrode of the light-emitting element.

15. The display substrate according to claim 12, wherein the storage sub-circuit comprises: a storage capacitor; wherein
a first terminal of the storage capacitor is coupled to the data writing circuit, and a second terminal of the storage capacitor is coupled to the light emission control sub-circuit.

16. The display substrate according to claim 11, wherein the initializing circuit comprises: a first initializing transistor and a second initializing transistor; wherein
a gate of the first initializing transistor and a gate of the second initializing transistor are coupled to the second scanning line, a first electrode of the first initializing transistor and a first electrode of the second initializing transistor are coupled to the initializing signal line, a second electrode of the first initializing transistor is coupled to the light emission drive circuit, and a second electrode of the second initializing transistor is coupled to the first electrode of the light-emitting element.

17. A method for driving a display substrate, applicable to drive the display substrate as defined in claim 1, the method comprising:
providing, by the plurality of switching control lines, the switching control signals in different periods of time;
providing, by the plurality of first scanning lines, the first scanning signals in different periods of time; and
controlling, by the data writing circuits in the plurality of pixel circuits comprised in the different pixel circuit subgroups, the connection of the data signal line to the drive circuit in response to the first scanning signal and the switching control signal at different time, to enable the data signal line to transmit the data signal from the data line to the drive circuit.

18. A display apparatus, comprising: a first drive circuit, a second drive circuit, and a display substrate; wherein
the first drive circuit is coupled to a plurality of switching control lines in the display substrate, and the first drive circuit is configured to provide a switching control signal for the plurality of switching control lines;
the second drive circuit is coupled to a plurality of data lines in the display substrate, and the second drive circuit is configured to provide a data signal for the plurality of data lines;
and the display substrate comprises:
a substrate comprising a display region and a non-display region, wherein the display region is surrounded by at least part of the non-display region;
a plurality of light-emitting elements disposed in the display region;
a plurality of pixel circuit groups disposed in the display region, at least one of the pixel circuit groups comprising a plurality of pixel circuit subgroups arranged in a first direction, each of the plurality of pixel circuit subgroups comprising a plurality of pixel circuits arranged in a second direction, and the first direction intersecting the second direction;
a plurality of first scanning lines and a plurality of data signal lines disposed in the display region and the non-display region and coupled to the plurality of pixel circuit subgroups in the plurality of pixel circuit groups; and
a plurality of switching control lines and a plurality of data lines disposed in the non-display region and coupled to the plurality of pixel circuit subgroups in the plurality of pixel circuit groups;
wherein at least one of the pixel circuits comprises a data writing circuit and a drive circuit; the data writing circuit being coupled to the first scanning line, the switching control line, the data signal line, and the drive circuit, and the data writing circuit being configured to control, in response to a first scanning signal provided by the first scanning line and a switching control signal provided by the switching control line, connection and disconnection between the data signal line and the drive circuit; the drive circuit being further coupled to the light-emitting element, and the drive circuit being configured to drive the light-emitting element to emit light in response to a data signal provided by the data writing circuit; and
the pixel circuits comprised in the same pixel circuit subgroup being coupled to the same switching control line, and the pixel circuits comprised in the same pixel circuit subgroup being coupled to the same data signal line; the plurality of pixel circuit subgroups in the same pixel circuit group being coupled to different switching control lines, and the plurality of data signal lines coupled to the plurality of pixel circuit subgroups in the same pixel circuit group being coupled to the same data line, wherein the plurality of data signal lines are configured to receive a data signal from the data line.

19. The display apparatus according to claim 18, wherein the first drive circuit and the second drive circuit are integrated.

20. The display apparatus according to claim 18, wherein at least two pixel circuit subgroups in different pixel circuit groups are configured to share one of the plurality of switching control lines.

* * * * *